(12) United States Patent
Kobatake et al.

(10) Patent No.: US 12,152,169 B2
(45) Date of Patent: Nov. 26, 2024

(54) ADHESIVE CONDUCTIVE PASTE

(71) Applicant: DAICEL CORPORATION, Osaka (JP)

(72) Inventors: Takanori Kobatake, Tokyo (JP); Tomoya Egawa, Tokyo (JP); Yasuyuki Akai, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 329 days.

(21) Appl. No.: 17/632,880

(22) PCT Filed: Aug. 4, 2020

(86) PCT No.: PCT/JP2020/029758
§ 371 (c)(1),
(2) Date: Feb. 4, 2022

(87) PCT Pub. No.: WO2021/025003
PCT Pub. Date: Feb. 11, 2021

(65) Prior Publication Data
US 2022/0275247 A1     Sep. 1, 2022

(30) Foreign Application Priority Data
Aug. 7, 2019   (JP) ................. 2019-145510

(51) Int. Cl.
C09J 1/00      (2006.01)
C09J 9/02      (2006.01)
C09J 11/06     (2006.01)

(52) U.S. Cl.
CPC .  *C09J 1/00* (2013.01); *C09J 9/02* (2013.01); *C09J 11/06* (2013.01); *C09J 2203/326* (2013.01)

(58) Field of Classification Search
CPC .............................. C09J 1/00; C09J 2203/326
See application file for complete search history.

(56) References Cited

U.S. PATENT DOCUMENTS

2017/0043396 A1\*  2/2017  Koduma .............. C09D 11/101
2019/0185684 A1    6/2019  Yamada et al.

FOREIGN PATENT DOCUMENTS

JP    2009-170277 A      7/2009
WO   WO 2015/183078 A1   10/2015
WO   WO-2017038572 A1 \*  3/2017  ................ B22F 1/02

OTHER PUBLICATIONS

Extended European Search Report for European Application No. 20850274.0, dated Jul. 26, 2023.
International Preliminary Report on Patentability and Written Opinion of the International Searching Authority for International Application No. PCT/JP2020/029758, dated Feb. 8, 2022 with English translation.
International Search Report for International Application No. PCT/JP2020/029758, dated Oct. 20, 2020, with an English translation.
Li, et al., "Recent advances of conductive adhesives as a lead-free alternative in electronic packaging: Materials, processing, reliability and applications", Materials Science and Engineering R 51, 2006, pp. 1-35.

\* cited by examiner

*Primary Examiner* — Daniel McNally
(74) *Attorney, Agent, or Firm* — Birch, Stewart, Kolasch & Birch, LLP

(57) ABSTRACT

An object of the present disclosure is to provide a paste that can suppress fluctuations in viscosity at a printing temperature to perform printing without unevenness, and is sintered fast even in an inert gas atmosphere such as nitrogen to form a highly accurate conductive wiring and a joined structure excellent in joining strength. The present disclosure provides an adhesive conductive paste for forming a conductive wiring and/or a joined structure to connect electronic elements, the adhesive conductive paste including a conductive particle and a solvent. The adhesive conductive paste contains, as the conductive particle, a silver particle (A) having an average particle size of 1 nm or greater and less than 100 nm and a silver particle (B) having an average particle size of 0.1 μm or greater and 10 μm or less, the silver particle (A) being a silver nanoparticle having a configuration in which a surface is coated with a protective agent containing amine, and the adhesive conductive paste contains, as the solvent, a compound (C) represented by Formula (I) below:

$$R^a\text{—O—}(X\text{—O})_n\text{—}R^b \qquad (I)$$

where in Formula (I), $R^a$ represents a monovalent group selected from a hydrocarbon group having from 1 to 6 carbon atom(s) and an acyl group, X represents a divalent group selected from a hydrocarbon group having from 2 to 6 carbon atoms, $R^b$ represents a hydrogen atom or a monovalent group selected from a hydrocarbon group having from 1 to 6 carbon atom(s) and an acyl group, $R^a$ and $R^b$ may be the same, n represents an integer from 1 to 3.

8 Claims, No Drawings

ADHESIVE CONDUCTIVE PASTE

TECHNICAL FIELD

The present disclosure relates to an adhesive conductive paste used in applications for forming a conductive wiring and a joined structure to connect electronic elements such as a power semiconductor element and an LED element. The present application claims priority from the Japanese Patent Application No. 2019-145510, filed in Japan on Aug. 7, 2019, the contents of which are incorporated herein by reference.

BACKGROUND ART

In installing an electronic element such as a power semiconductor element, an LED element etc., joining multiple materials with high strength is required. For this reason, a conductive wiring, a joined structure, or a wiring board including the conductive wiring and the joined structure is used.

As a method of forming the conductive wiring, for example, a method of manufacturing a copper wiring by etching a copper foil joined to an insulating substrate has been known. However, the above method has a problem that a large amount of waste is generated through etching.

Another method is known, in which a conductive paste containing conductive particles and an adhesive is applied onto an insulating substrate by a printing method or the like, and the substrate is then sintered, so as to manufacture a conductive wiring (Non-Patent Literature 1). Since the conductive paste containing the adhesive has appropriate viscosity, printing can be performed with high accuracy, and a wiring is manufactured by sintering the conductive paste. However, since the adhesive, which is a non-conductive component, and/or a component derived from the adhesive remain after sintering, the interaction amongst the conductive particles and between the conductive particles and the substrate is inhibited, and thus it is difficult to achieve good conductivity.

Patent Document 1 discloses that using a conductive paste which does not contain an adhesive and a thickener and is obtained by mixing silver particles having an average particle size (median diameter) from 0.1 μm to 15 μm with an alcohol solvent (methanol, ethanol, or ethylene glycol) can suppress residual non-conductive components after sintering and reduce an electric resistance value. Here, a copper substrate, a nickel substrate, and a wiring that are not plated and protected in a semiconductor module are easily oxidized by oxygen, and need to be sintered in an inert gas atmosphere such as nitrogen. However, in a conductive paste containing silver particles having an average particle size of 0.1 μm or greater, sintering does not proceed in a nitrogen atmosphere, and joining the substrate and wiring is difficult. In addition, the conductive paste using the alcohol solvent is likely to cause "bleeding", and methanol and ethanol have a high volatilization rate at a printing temperature, and thus the conductive paste using the alcohol solvent is likely to fluctuate in viscosity at the time of printing, and it is difficult to form fine patterns with high accuracy. In addition, the conductive paste using ethylene glycol has a problem in that it is difficult to obtain a conductive wiring having excellent joining strength with a substrate.

CITATION LIST

Patent Documents

Patent Document 1: JP 2009-170277 A

Non-Patent Literature

Non-Patent Literature 1: Yi Li, C. P. Wong, "Recent advances of conductive adhesives as a lead-free alternative in electronic packaging: Materials, processing, reliability and applications", Materials Science and Engineering, 2006, R51, p 1-35

SUMMARY OF INVENTION

Technical Problem

Accordingly, an object of the present disclosure is to provide an adhesive conductive paste for forming a conductive wiring and a joined structure to connect an electronic element on a substrate by a printing method or the like, the adhesive conductive paste that is capable of suppressing fluctuations in viscosity at a printing temperature to perform printing without unevenness, and capable of forming a conductive wiring and a joined structure which are highly accurate and capable of connecting a substrate and an electronic element with high joining strength by sintering fast even in an inert gas atmosphere such as nitrogen.

Solution to Problem

As a result of intensive studies to solve the above problems, the inventors of the present disclosure have found that when silver particles having an average particle size (median diameter) of less than 0.1 μm (100 nm) are blended in addition to silver particles having an average particle size (median diameter) of 0.1 μm or greater, it is possible to form a conductive wiring and a joined structure which are highly accurate and capable of connecting a substrate and an electronic element with high joining strength by sintering fast even in an inert gas atmosphere such as nitrogen. Furthermore, the present inventors have found that a paste containing a compound represented by Formula (I) below as a solvent and containing silver particles having two different particle sizes as conductive particles has a viscosity suitable for printing without adding a thickener, and printing can be performed without causing bleeding, the compound represented by the Formula (I) is less likely to volatilize at a printing temperature, and a paste containing the compound represented by the Formula (I) as a solvent can suppress fluctuations in viscosity at the time of printing, can perform printing without unevenness, and can form a sintered body excellent in conductivity even at a low temperature. The invention of the present disclosure was completed based on these findings.

That is, the present disclosure provides an adhesive conductive paste for forming a conductive wiring and/or a joined structure to connect an electronic element, the adhesive conductive paste including a conductive particle and a solvent, wherein the conductive particle includes a silver particle (A) having an average particle size of 1 nm or greater and less than 100 nm and a silver particle (B) having an average particle size of 0.1 μm or greater and 10 μm or less, the silver particles (A) being a silver nanoparticle having a configuration in which a surface is coated with a protective agent containing amine, and wherein the solvent includes a compound (C) that is represented Formula (I) below:

$$R^a-O-(X-O)_n-R^b \quad (I)$$

where in Formula (I), $R^a$ represents a monovalent group selected from a hydrocarbon group having from 1 to 6 carbon atom(s) and an acyl group, X represents a divalent group selected from a hydrocarbon group having from 2 to 6 carbon atoms, $R^b$ represents a hydrogen atom or a monovalent group selected from a hydrocarbon group having 1 to 6 carbon atom(s) and an acyl group, $R^a$ and $R^b$ may be the same, and n represents an integer from 1 to 3.

The present disclosure also provides the adhesive conductive paste wherein the silver particle (A) is contained at a proportion of 50 wt. % or less out of all silver particles contained in the adhesive conductive paste.

The present disclosure also provides the adhesive conductive paste, wherein the protective agent in the silver particle (A) contains, as the amine, an aliphatic hydrocarbon monoamine (1) including an aliphatic hydrocarbon group and one amino group, the aliphatic hydrocarbon group having 6 or more carbon atoms in total, and the protective agent further contains at least one of an aliphatic hydrocarbon monoamine (2) or an aliphatic hydrocarbon diamine (3), the aliphatic hydrocarbon monoamine (2) including an aliphatic hydrocarbon group and one amino group, the aliphatic hydrocarbon group having 5 or less carbon atoms in total, and the aliphatic hydrocarbon diamine (3) including an aliphatic hydrocarbon group and two amino groups, the aliphatic hydrocarbon group having 8 or less carbon atoms in total.

The present disclosure also provides the adhesive conductive paste, wherein the compound (C) represented by Formula (I) has a boiling point of 160° C. or higher under normal pressure.

The present disclosure also provides the adhesive conductive paste, wherein the compound (C) represented by Formula (I) has a SP value $[(cal/cm^3)^{1/2}]$ of 8.6 or less at 25° C.

The present disclosure also provides the adhesive conductive paste, wherein X in Formula (I) is an ethylene group, a propylene group, or a trimethylene group.

The present disclosure also provides the adhesive conductive paste, wherein a total content of the silver particle (A) and the silver particle (B) in a total amount of the adhesive conductive paste is from 50 to 99.8 wt. %.

The present disclosure also provides the adhesive conductive paste, wherein a content of an organic component is 15 wt. % or less relative to 100 wt. % of the adhesive conductive paste.

The present disclosure also provides a method of manufacturing an electronic component, the method including applying the adhesive conductive paste onto a substrate and subsequently sintering the substrate, so as to form a conductive wiring and/or a joined structure.

Advantageous Effects of Invention

Since the adhesive conductive paste of the present disclosure contains, as conductive particles, silver particles having two different particle sizes, which are silver particles (A) having an average particle size of 1 nm or more and less than 100 nm and silver particles (B) having an average particle size of 0.1 μm or more and 10 μm or less, it is possible to form a conductive wiring and a joined structure which are highly accurate and capable of connecting a substrate and an electronic element with high joining strength by sintering fast even in an inert gas atmosphere such as nitrogen. Furthermore, since the adhesive conductive paste further contains the compound (C) represented by Formula (I) as a solvent in addition to the silver particles (A) and (B), it has a viscosity suitable for printing methods and is less likely to cause bleeding, and thus can form a conductive wiring pattern and a joined structure pattern with high accuracy by printing. In addition, it is not necessary to add an adhesive to thicken the adhesive conductive paste of the present disclosure. Although there is a problem in that electrical characteristics are deteriorated by a non-conductive component derived from the adhesive remaining after sintering in the known art, it is possible to prevent such deterioration of the electrical characteristics due to the residual non-conductive component, thereby forming a conductive wiring and a joined structure excellent in the electrical characteristics.

Furthermore, since the adhesive conductive paste of the present disclosure uses the compound (C) represented by Formula (I) which is less likely to volatilize at a printing temperature as a solvent, it is possible to keep the viscosity constant during printing, and highly accurate printing without unevenness can be performed.

Furthermore, the adhesive conductive paste of the present disclosure can form a conductive wiring and a joined structure excellent in joining strength with respect to a substrate even when sintered at a lower temperature, and can reduce deterioration or damage of the substrate due to the sintering.

Therefore, by using the adhesive conductive paste of the present disclosure, the conductive wiring and the joined structure excellent in joining strength can be accurately formed through a printing method, and a substrate and an electronic element can be joined to each other with appropriate strength through the conductive wiring and the joined structure, and thus an electronic component excellent in the electrical characteristics can be manufactured.

DESCRIPTION OF EMBODIMENTS

Solvent

An adhesive conductive paste of the present disclosure includes one, or two or more kinds of compounds (C) represented by Formula (I) below, as a solvent:

$$R^a-O-(X-O)_n-R^b \quad (I)$$

In Formula (I), $R^a$ represents a monovalent group selected from a hydrocarbon group having 1 to 6 carbon atom(s) and an acyl group.

Examples of the hydrocarbon group having 1 to 6 carbon atom(s) in $R^a$ include a monovalent group selected from an aliphatic hydrocarbon group having from 1 to 6 carbon atom(s) and an alicyclic hydrocarbon group having from 3 to 6 carbon atoms. Examples of the monovalent aliphatic hydrocarbon group having from 1 to 6 carbon atom(s) include linear or branched alkyl groups having from 1 to 6 carbon atom(s) such as a methyl group, an ethyl group, a propyl group, an isopropyl group, a butyl group, an isobutyl group, an s-butyl group, a t-butyl group, a pentyl group, an isopentyl group, a hexyl group, and an isohexyl group; alkenyl groups having from 2 to 6 carbon atoms such as a vinyl group, an allyl group, and a 1-butenyl group; and alkynyl groups having from 2 to 6 carbon atoms such as an ethynyl group and a propynyl group. Examples of the monovalent alicyclic hydrocarbon group having from 3 to 6 carbon atoms include cycloalkyl groups such as a cyclopropyl group, a cyclobutyl group, a cyclopentyl group, and a cyclohexyl group.

Examples of the acyl groups (RCO-groups) in $R^a$ described above may include acyl groups (for example, an acetyl group, a propionyl group, a butyryl group, an isobutyryl group, and a pivaloyl group) in which R described above is a linear or branched alkyl group having from 1 to 10 carbon atom(s), preferably, from 1 to 5 carbon atom(s).

In Formula (I), X represents a divalent group selected from a hydrocarbon group having from 2 to 6 carbon atoms. Examples of the hydrocarbon group having from 2 to 6 carbon atoms in X include a divalent group selected from an aliphatic hydrocarbon group having from 2 to 6 carbon atoms and an alicyclic hydrocarbon group having from 3 to 6 carbon atoms. Examples of the divalent aliphatic hydrocarbon group having from 2 to 6 carbon atoms include linear or branched alkylene groups such as an ethylene group (—$CH_2$—$CH_2$—), a propylene group (—$CH(CH_3)CH_2$—), a trimethylene group (—$CH_2$—$CH_2$—$CH_2$—), and the like. Examples of the divalent alicyclic hydrocarbon group having 3 to 6 carbon atoms include cycloalkylene groups such as a 1,2-cyclopentylene group, a 1,3-cyclopentylene group, a 1,2-cyclohexylene group, a 1,3-cyclohexylene group, and a 1,4-cyclohexylene group. In the present disclosure, X is preferably an aliphatic hydrocarbon group having from 2 to 6 carbon atoms, more preferably a linear or branched alkylene group having from 2 to 6 carbon atoms, and still more preferably an ethylene group, a propylene group, or a trimethylene group.

In Formula (I), $R^b$ represents a hydrogen atom or a monovalent group selected from a hydrocarbon group having from 1 to 6 carbon atom(s) and an acyl group. Examples of the monovalent group selected from an aliphatic hydrocarbon group having from 1 to 6 carbon atom(s) and an acyl group include the same examples as those in $R^a$. $R^b$ and $R^a$ may be the same or different.

n represents an integer from 1 to 3; n is preferably 2 or 3.

The number of carbon atoms constituting the compound (C) represented by Formula (I) is preferably from 8 to 13, and more preferably from 10 to 12 from the viewpoint of hardly volatilizing at a printing temperature and more quickly volatilizing at a sintering temperature.

The compound (C) represented by Formula (I) is preferably less likely to volatilize at a printing temperature, and the boiling point (under normal pressure) is, for example, 160° C. or higher, preferably 190° C. or higher, more preferably 190° C. to 290° C., and still more preferably 200° C. to 260° C. When the boiling point is below the above range, the adhesive conductive paste is likely to volatilize and change in viscosity during preparation or printing of the adhesive conductive paste, and it tends to be difficult to form the conductive wiring and the joined structure without unevenness but with high accuracy.

In addition, it is preferable that the compound (C) represented by Formula (I) volatilizes quickly during sintering, and a square root of the cohesive energy density (SP value; $(cal/cm^3)^{1/2}$) is, for example, 11.0 or less, preferably 10.0 or less, and more preferably 9.0 or less. The SP value (at 25° C.) can be calculated by Fedors' equation.

Specific examples of the case where, in the compound (C) represented by Formula (I), $R^a$ is a hydrocarbon group having 1 to 6 carbon atom(s), $R^b$ is a hydrogen atom or a hydrocarbon group having 1 to 6 carbon atom(s), X is a propylene group, and n is 2 include dipropylene glycol mono$C_{1-6}$ alkyl ethers such as dipropylene glycol monomethyl ether, dipropylene glycol monoethyl ether, dipropylene glycol monopropyl ether, dipropylene glycol monoisopropyl ether, dipropylene glycol monobutyl ether, dipropylene glycol monoisobutyl ether, dipropylene glycol monopentyl ether, and dipropylene glycol monoisopentyl ether; and dipropylene glycol di$C_{1-6}$ alkyl ethers such as dipropylene glycol dimethyl ether, dipropylene glycol methyl ethyl ether, dipropylene glycol methyl propyl ether, dipropylene glycol methyl butyl ether, dipropylene glycol methyl isobutyl ether, dipropylene glycol methyl pentyl ether, dipropylene glycol methyl isopentyl ether, dipropylene glycol diethyl ether, dipropylene glycol ethyl propyl ether, dipropylene glycol ethyl butyl ether, dipropylene glycol ethyl isobutyl ether, dipropylene glycol ethyl pentyl ether, dipropylene glycol ethyl isopentyl ether, dipropylene glycol dipropyl ether, dipropylene glycol propyl butyl ether, dipropylene glycol propyl isobutyl ether, dipropylene glycol propyl pentyl ether, dipropylene glycol propyl isopentyl ether, dipropylene glycol dibutyl ether, dipropylene glycol diisobutyl ether, dipropylene glycol butyl isobutyl ether, dipropylene glycol butyl pentyl ether, dipropylene glycol butyl isopentyl ether, dipropylene glycol isobutyl pentyl ether, dipropylene glycol isobutyl isopentyl ether, dipropylene glycol dipentyl ether, and dipropylene glycol pentyl isopentyl ether (including isomers thereof).

Specific examples of the case where, in the compound (C) represented by Formula (I), $R^a$ is a hydrocarbon group having from 1 to 6 carbon atom(s), $R^b$ is a hydrogen atom or a hydrocarbon group having from 1 to 6 carbon atom(s), X is a propylene group, and n is 3 include tripropylene glycol mono$C_{1-6}$ alkyl ethers such as tripropylene glycol monomethyl ether, tripropylene glycol monoethyl ether, tripropylene glycol monopropyl ether, tripropylene glycol monoisopropyl ether, tripropylene glycol monobutyl ether, tripropylene glycol monoisobutyl ether, tripropylene glycol monopentyl ether, and tripropylene glycol monoisopentyl ether; and tripropylene glycol di$C_{1-6}$ alkyl ethers such as tripropylene glycol dimethyl ether, tripropylene glycol methyl ethyl ether, tripropylene glycol methyl propyl ether, tripropylene glycol methyl butyl ether, tripropylene glycol methyl isobutyl ether, tripropylene glycol methyl pentyl ether, tripropylene glycol methyl isopentyl ether, tripropylene glycol diethyl ether, tripropylene glycol ethyl propyl ether, tripropylene glycol ethyl butyl ether, tripropylene glycol ethyl isobutyl ether, tripropylene glycol ethyl pentyl ether, tripropylene glycol ethyl isopentyl ether, tripropylene glycol dipropyl ether, tripropylene glycol propyl butyl ether, tripropylene glycol propyl isobutyl ether, tripropylene glycol propyl pentyl ether, tripropylene glycol propyl isopentyl ether, tripropylene glycol dibutyl ether, tripropylene glycol diisobutyl ether, tripropylene glycol butyl isobutyl ether, tripropylene glycol butyl pentyl ether, tripropylene glycol butyl isopentyl ether, tripropylene glycol isobutyl pentyl ether, tripropylene glycol isobutyl isopentyl ether, tripropylene glycol dipentyl ether, and tripropylene glycol pentyl isopentyl ether (including isomers thereof).

Specific examples of the case where, in the compound (C) represented by Formula (I), $R^a$ is a hydrocarbon group having from 1 to 6 carbon atom(s), $R^b$ is a hydrogen atom or a hydrocarbon group having from 1 to 6 carbon atom(s), X is an ethylene group, and n is an integer from 1 to 3 include ethylene glycol mono$C_{1-6}$ alkyl ethers such as ethylene glycol monomethyl ether, ethylene glycol monoethyl ether, ethylene glycol monopropyl ether, ethylene glycol monoisopropyl ether, ethylene glycol monobutyl ether, ethylene glycol monoisobutyl ether, and ethylene glycol monohexyl ether; ethylene glycol di$C_{1-6}$ alkyl ethers such as ethylene glycol methyl-n-propyl ether, ethylene glycol methyl-n- butyl ether, and ethylene glycol methyl isoamyl ether; diethylene glycol mono-$C_{1-6}$ alkyl ethers such as diethylene glycol monomethyl ether, diethylene glycol monoethyl ether, diethylene glycol monoisopropyl ether, and diethylene glycol monobutyl ether; diethylene glycol di$C_{1-6}$ alkyl ethers such as diethylene glycol dimethyl ether, diethylene glycol diethyl ether, diethylene glycol ethyl methyl ether, diethylene glycol isopropylmethyl ether, and diethylene glycol methyl-n-butyl ether; triethylene glycol mono$C_{1-6}$ alkyl ethers such as triethylene glycol monomethyl ether and triethylene glycol monobutyl ether; and triethylene glycol di-$C_{1-10}$ alkyl ethers such as triethylene glycol methyl-n-butyl ether (including isomers thereof).

Specific examples of the case where, in the compound (C) represented by Formula (I), $R^a$ is an acyl group, $R^b$ is a hydrogen atom or a monovalent group selected from a hydrocarbon group having from 1 to 6 carbon atom(s) and an acyl group, X is an ethylene group or a propylene group, and n is an integer from 1 to 3 include $C_{2-3}$ alkylene glycol $C_{1-6}$ alkyl ether $C_{1-10}$ alkyl esters such as ethylene glycol monomethyl ether acetate, ethylene glycol monobutyl ether acetate, propylene glycol monomethyl ether acetate; di$C_{2-3}$ alkylene glycol $C_{1-6}$ alkyl ether $C_{1-10}$ alkyl esters such as diethylene glycol-n-butyl ether acetate, diethylene glycol ethyl ether acetate, diethylene glycol butyl ether acetate, and dipropylene glycol methyl ether acetate; tri$C_{2-3}$ alkylene glycol $C_{1-6}$ alkyl ether $C_{1-10}$ alkyl ester such as triethylene glycol-n-butyl ether acetate, triethylene glycol ethyl ether acetate, triethylene glycol butyl ether acetate, and tripropylene glycol methyl ether acetate; and $C_{2-3}$ alkylene glycol di$C_{1-10}$ alkyl esters such as propylene glycol diacetate (including isomers thereof).

Specific examples of the compound (C) represented by Formula (I) where $R^a$, $R^b$, X, and n in Formula (I) are other than those described above include compounds corresponding to the above examples.

One kind of these solvents can be used alone or two or more kinds in combination. Among these, it is preferable to appropriately select the kind and the content, and thus the conditions described above are matched.

The adhesive conductive paste of the present disclosure may contain one, or two or more kinds of other solvents (for example, ethyl lactate acetate, tetrahydrofurfuryl acetate, tetrahydrofurfuryl alcohol, and ethylene glycol) in addition to the above, and the content of these solvents is, for example, preferably 30 wt. % or less, more preferably 20 wt. % or less, still more preferably 15 wt. % or less, further still more preferably 10 wt. % or less, even more preferably 5 wt. % or less, and even still more preferably 1 wt. % or less relative to the total amount of the solvents contained in the adhesive conductive paste of the present disclosure. When the content of the other solvents exceeds the above range, clogging of a coating device tends to easily occur when a solvent having excessively high volatility is contained in a large amount, and when a solvent having excessively low volatility is contained in a large amount, the quick drying property is impaired, it is necessary to perform a treatment such as heating for drying after coating, and workability tends to be deteriorated.

Therefore, the proportion of the content of the compound (C) represented by Formula (I) in the total amount of the solvent is, for example, from 70 to 100 wt. %, and the lower limit is preferably 80 wt. %, more preferably 85 wt. %, still more preferably 90 wt. %, further still more preferably 95 wt. %, and even more preferably 99 wt. %.

The content of the compound (C) represented by Formula (I) is, for example, from 1 to 50 parts by weight, preferably from 2 to 30 parts by weight, and more preferably from 3 to 30 parts by weight, relative to 100 parts by weight of conductive particles (total of silver particles (A) and silver particles (B)).

Conductive Particles

The adhesive conductive paste of the present disclosure contains silver particles (A) having an average particle size of 1 nm or greater and less than 100 nm and silver particles (B) having an average particle size of 0.1 μm or greater and 10 μm or less as conductive particles.

Silver Particle (A)

The silver particles (A) contained in the adhesive conductive paste of the present disclosure are silver nanoparticles having an average particle size of 1 nm or greater and less than 100 nm and having a configuration in which a surface is coated with a protective agent containing amine, more specifically, a configuration in which a non-covalent electron pair of amine is electrically coordinated to the surface of the silver particles (A). Since the silver particles (A) in the present disclosure have the above configuration, re-aggregation between the silver particles (A) is prevented, and a highly dispersed state can be stably maintained in the adhesive conductive paste.

The average particle size (median diameter) of the silver particles (A) is 0.1 nm or more and less than 100 nm, preferably from 0.5 to 90 nm, more preferably from 1 to 80 nm, and still more preferably from 1 to 75 nm as described above. Note that, the particle size is determined as an average particle size (median diameter) converted into a volume distribution on the assumption that the particles have an aspect ratio of 1, based on the particle size determined by transmission electron microscope (TEM) observation.

The proportion of the silver particles (A) in the total silver particles contained in the adhesive conductive paste of the present disclosure is, for example, 50 wt. % or less, preferably 45 wt. % or less, and more preferably 40 wt. % or less. When the content of the silver particles (A) is within the above-mentioned range, it is preferable from the viewpoint of improving the printability, and from the viewpoint of being able to form a high joining strength between the substrate and the electronic element by sintering fast even under an inert gas atmosphere such as nitrogen. On the other hand, the proportion of the silver particles (A) is, for example, 1 wt. % or greater, preferably 3 wt. % or greater, and more preferably 4 wt. % or greater.

The content of the silver particles (A) is, for example, from 1 to 45 wt. %, preferably from 2 to 43 wt. %, and more preferably from 3 to 40 wt. % of the total amount of the adhesive conductive paste in that a sintered body having good conductivity can be obtained, that dispersion stability is excellent (that is, high dispersibility can be stably maintained over a long period of time, and an increase in viscosity can be suppressed), that printability is improved, that a substrate and an electronic element can be sintered fast even in an inert gas atmosphere such as nitrogen to form a high joining strength.

Method of Manufacturing Silver Particle (A)

The silver particles (A) may be produced by mixing amine and a silver compound to form a complex compound containing the silver compound and the amine, and heating and thermally decomposing the complex compound. Thus, the method of manufacturing the silver particles (A) mainly includes forming a complex compound and thermally decomposing the complex compound.

In the present disclosure, as the silver compound, a silver compound that is easily decomposed by heating to produce metallic silver is used. Examples of such a silver compound include silver carboxylates, such as silver formate, silver acetate, silver oxalate, silver malonate, silver benzoate, and silver phthalate; silver halides, such as silver fluoride, silver chloride, silver bromide, and silver iodide; and silver sulfate, silver nitrate, and silver carbonate, and silver oxalate is preferably used from the viewpoint that metallic silver is easily produced by decomposition and impurities other than silver are less likely to be generated. The silver oxalate is advantageous in that silver content is high, and metal silver is obtained as is by thermal decomposition without the need for a reducing agent, and the impurities originating from the reducing agent are less likely to remain.

Furthermore, to obtain a composite with silver, the silver compound described above and other metal compounds other than silver may be used in combination. Other metal compounds are easily decomposed by heating, and the metal compounds that produce the target metal are used. As other metal compounds, salts of metals such as those corresponding to the silver compounds described above, for example, metal carboxylates; metal halides; metal salt compounds such as metal sulfates, metal nitrates, metal carbonates, and the like can be used. Among these, metal oxalate is preferably used from the viewpoint that the metal is easily generated by decomposition and the impurities other than the metal are less likely to be generated. Examples of other metals include Al, Au, Pt, Pd, Cu, Co, Cr, In, and Ni. The silver composite is made of silver and one, or two or more of the other metals, and examples thereof include Au—Ag, Ag—Cu, Au—Ag—Cu, and Au—Ag—Pd. Based on the total metal, silver is at least 20 wt. %, usually at least 50 wt. %, for example at least 80 wt. %.

In the present disclosure, in forming a complex compound, amine and a silver compound may be mixed in the absence of a solvent, but it is preferable to form a complex compound containing the silver compound and the amine by mixing in the presence of an alcohol solvent having 3 or more carbon atoms.

As the alcohol solvent, alcohol having from 3 to 10 carbon atoms, preferably alcohol having from 4 to 6 carbon atoms can be used. Examples thereof include n-propanol (boiling point bp: 97° C.), isopropanol (bp: 82° C.), n-butanol (bp: 117° C.), isobutanol (bp: 107.89° C.), sec-butanol (bp: 99.5° C.), tert-butanol (bp: 82.45° C.), n-pentanol (bp: 136° C.), n-hexanol (bp: 156° C.), n-octanol (bp: 194° C.), and 2-octanol (bp: 174° C.). Among them, butanols and hexanols selected from n-butanol, isobutanol, sec-butanol, and tert-butanol are preferable in consideration of the ability to increase the temperature in the thermally decomposing a complex compound to be performed later, the convenience in the post-treatment after the formation of the silver particles (A), and the like. In particular, n-butanol and n-hexanol are preferable.

In addition, the alcohol solvent is preferably used in an amount of, for example, 120 parts by weight or greater, preferably 130 parts by weight or greater, and more preferably 150 parts by weight or more relative to 100 parts by weight of the silver compound to sufficiently stir the silver compound-alcohol slurry. The upper limit of the amount of the alcohol-based solvent is not particularly limited, and may be, for example, 1000 parts by weight or less, preferably 800 parts by weight or less, and more preferably 500 parts by weight or less, relative to 100 parts by weight of the silver compound.

In the present disclosure, mixing amine and a silver compound in the presence of the alcohol solvent having 3 or more carbon atoms can take several forms.

For example, first, a solid silver compound and an alcohol solvent are mixed to obtain a silver compound-alcohol slurry [forming a slurry], and then amine may be added to the obtained silver compound-alcohol slurry. The slurry represents a mixture in which a solid silver compound is dispersed in an alcohol solvent. A solid silver compound is charged in a reaction vessel, and the alcohol solvent is preferably added thereto to obtain a slurry.

Alternatively, the amine and the alcohol solvent may be charged into a reaction vessel, and a silver compound-alcohol slurry may be added to the reaction vessel.

In the present disclosure, examples of the amine that functions as a complexing agent and/or a protective agent include aliphatic hydrocarbon monoamine (1) in which the aliphatic hydrocarbon group having 6 or more carbon atoms in total, and at least one of aliphatic hydrocarbon monoamine (2) including an aliphatic hydrocarbon group or one amino group, the aliphatic hydrocarbon group having 5 or less carbon atoms in total, or aliphatic hydrocarbon diamine (3) including an aliphatic hydrocarbon group and two amino groups, the aliphatic hydrocarbon group having 8 or less carbon atoms in total. Each of these components is usually used as an amine mixed solution, but mixing of the amine with the silver compound (or alcohol slurry thereof) is not necessarily performed using amines in a mixed state. The amines may be added sequentially to the silver compound (or an alcohol slurry thereof).

As established herein, the term "aliphatic hydrocarbon monoamine" is a compound including 1 to 3 monovalent aliphatic hydrocarbon groups and one amino group. The "Hydrocarbon group" is a group including only carbon and hydrogen. However, the aliphatic hydrocarbon monoamine (1) and the aliphatic hydrocarbon monoamine (2) may have substituents that include heteroatoms (atoms other than carbon and hydrogen) such as oxygen atoms or nitrogen atoms in the hydrocarbon group, as necessary. This nitrogen atom does not constitute an amino group.

Furthermore, the "aliphatic hydrocarbon diamine" is a compound including a divalent aliphatic hydrocarbon group (alkylene group), two amino groups that are interposed by the aliphatic hydrocarbon group, and, in some cases, an aliphatic hydrocarbon group (alkyl group) substituted with a hydrogen atom of the amino group. However, the aliphatic hydrocarbon diamine (3) may have substituents that include heteroatoms (atoms other than carbon and hydrogen) such as oxygen atoms or nitrogen atoms in the hydrocarbon group, as necessary. This nitrogen atom does not constitute an amino group.

The aliphatic hydrocarbon monoamine (1) having 6 or more carbon atoms in total has a high function as a protective agent (stabilizing agent) on the surface of the silver particles produced by the hydrocarbon chain thereof.

The aliphatic hydrocarbon monoamine (1) includes primary amine, secondary amine, and tertiary amine. Examples of the primary amine include saturated aliphatic hydrocarbon monoamines (that is, alkyl monoamine) having a linear aliphatic hydrocarbon group having from 6 to 18 carbon atoms, such as hexylamine, heptylamine, octylamine, nonylamine, decylamine, undecylamine, dodecylamine, tridecylamine, tetradecylamine, pentadecylamine, hexadecylamine, heptadecylamine, and octadecylamine. In addition to the linear aliphatic monoamines described above, examples of saturated aliphatic hydrocarbon monoamines include branched aliphatic hydrocarbon monoamines having branched aliphatic hydrocarbon groups having 6 to 16 carbon atoms, preferably 6 to 8 carbon atoms, such as isohexylamine, 2-ethylhexylamine, and tert-octylamine.

Moreover, cyclohexylamine is also exemplified. Furthermore, unsaturated aliphatic hydrocarbon monoamines such as oleylamine (that is, alkenyl monoamine).

Examples of the secondary amine include linear dialkyl monoamines such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine, and N-propyl-N-butylamine. Examples of tertiary amines include tributylamine, and trihexylamine.

Furthermore, examples of branched amines include secondary amines such as N,N-diisohexylamine, and N,N-di(2-ethylhexyl) amine. In addition, examples thereof include tertiary amines such as triisohexylamine and tri(2-ethylhexyl) amine. In the case of N,N-di(2-ethylhexyl) amine, the number of carbon atoms in the 2-ethylhexyl group is 8, but the total number of carbon atoms included in the amine compound is 16. In the case of tri(2-ethylhexyl) amine, the total number of carbon atoms included in the amine compound is 24.

Among the monoamines (1), a saturated aliphatic hydrocarbon monoamine having 6 or more carbon atoms is preferable in the case of being linear. When the number of carbon atoms is 6 or greater, a space between the silver particles and other silver particles can be secured when the amino group is adsorbed on the surfaces of the silver particles, and thus the action of preventing aggregation of the silver particles is improved. The upper limit of the number of carbon atoms is not particularly defined, and saturated aliphatic monoamines having up to 18 carbon atoms are normally preferable in consideration of ease of obtaining, ease of removal during calcining, and the like. In particular, alkyl monoamine having from 6 to 12 carbon atoms such as hexylamine, heptylamine, octylamine, nonylamine, decylamine, undecylamine, and dodecylamine are preferably used. Only one kind of the linear aliphatic hydrocarbon monoamines may be used, or two or more kinds thereof may be used in combination.

In addition, when a branched aliphatic hydrocarbon monoamine compound is used, it is possible to cover a larger surface area of the silver particle surface with a smaller adhesion amount onto the surface of the silver particles due to the steric factor of the branched aliphatic hydrocarbon group as compared to when a linear aliphatic hydrocarbon monoamine compound having the same carbon number is used. Therefore, moderate stabilization of the silver particles (A) can be obtained with a smaller adhesion amount onto the surface of the silver particles. Since the amount of the protective agent (organic stabilizer) to be removed is small during calcining, an organic stabilizer can be efficiently removed even in a case of calcination at a low temperature of 200° C. or lower, and the sintering of the silver particles sufficiently proceeds.

Among the branched aliphatic hydrocarbon monoamines, branched alkyl monoamine compounds having from 5 to 6 carbon atoms in the main chain, such as isohexylamine and 2-ethylhexylamine, are preferable. When the number of carbon atoms of the main chain is from 5 to 6, moderate stabilization of the silver particles (A) is easily obtained. In addition, from the viewpoint of the steric factor of the branched aliphatic group, it is effective that the branched group is branched at the second carbon atom from the N atom side as in 2-ethylhexylamine. As the branched aliphatic monoamine, only one kind may be used, or two or more kinds may be used in combination.

In the present disclosure, as the aliphatic hydrocarbon monoamine (1), the linear aliphatic hydrocarbon monoamine and the branched aliphatic hydrocarbon monoamine may be used in combination to obtain respective advantages.

Since the aliphatic hydrocarbon monoamine (2) having 5 or less carbon atoms in total has a shorter carbon chain length than the aliphatic monoamine (1) having 6 or more carbon atoms in total, it is considered that the aliphatic hydrocarbon monoamine itself has a low function as a protective agent (stabilizer). However, the aliphatic hydrocarbon monoamine has a higher polarity and high ability to coordinate a silver compound to silver as compared to the aliphatic monoamine (1), and therefore it is considered that the aliphatic hydrocarbon monoamine is effective in promoting complex formation. In addition, since the carbon chain length is short, the silver particles can be removed from the surfaces of the silver particles in a short time of 30 minutes or shorter or 20 minutes or shorter even in low-temperature calcining at, for example, 120° C. or lower or about 100° C. or lower, and thus the low-temperature calcining of the obtained silver particles (A) is effective.

Examples of the aliphatic hydrocarbon monoamine (2) include saturated aliphatic hydrocarbon monoamines having 2 to 5 carbon atoms (that is, alkyl monoamine) such as ethylamine, n-propylamine, isopropylamine, n-butylamine, isobutylamine, sec-butylamine, tert-butylamine, pentylamine, isopentylamine, and tert-pentylamine. In addition, examples thereof include dialkyl monoamines such as N,N-dimethylamine, N,N-diethylamine, N-methyl-N-propylamine, and N-ethyl-N-propylamine.

Among them, n-butylamine, isobutylamine, sec-butylamine, tert-butylamine, pentylamine, isopentylamine, tert-pentylamine, and the like are preferable, and the butylamines are more preferable. Only one kind of the aliphatic hydrocarbon monoamine (2) may be used, or two or more kinds thereof may be used in combination.

The aliphatic hydrocarbon diamine (3) having 8 or less carbon atoms in total has high ability to coordinate a silver compound to silver, and is effective in promoting complex formation. The aliphatic hydrocarbon diamine generally has a higher polarity than the aliphatic hydrocarbon monoamine, and has higher ability to coordinate the silver compound to silver. In addition, the aliphatic hydrocarbon diamine (3) has an effect of promoting thermal decomposition at a lower temperature in a shorter time in the thermally decomposing a complex compound, and can more efficiently produce silver nanoparticles. Furthermore, since a protective film of the silver particles containing the aliphatic diamine (3) has high polarity, the dispersion stability of the silver particles in the dispersion medium containing a highly polar solvent is improved. In addition, since the aliphatic diamine (3) has the short carbon chain length, the silver particles can be removed from the surfaces of the silver particles in a short time of 30 minutes or shorter or 20 minutes or shorter even in low-temperature calcining at, for example, 120° C. or lower or about 100° C. or lower, and thus the low-temperature and short-time calcining of the obtained silver particles (A) is effective.

The aliphatic hydrocarbon diamine (3) is not particularly limited, and examples thereof include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-propanediamine, N,N'-dimethyl-1,3-propanediamine, N,N-diethyl-1,3-propanediamine, N,N'-diethyl-1,3-propanediamine, 1,4-butanediamine, N,N-dimethyl-1,4-butanediamine, N,N'-dimethyl-1,4-butanediamine, N,N-diethyl-1,4-butanediamine, N,N'-diethyl-1,4-butanediamine, 1,5-pentanediamine, 1,5-diamino-2- methylpentane, 1,6-hexanediamine, N,N-dimethyl-1,6-hexanediamine, N,N'-dimethyl-1,6-hexanediamine, 1,7-heptanediamine, and 1,8-octanediamine. Each of these is alkylenediamine having 8 or less carbon atoms in total in which at least one of two amino groups is a primary amino group or a secondary amino group, and has high ability to coordinate a silver compound to silver, and is effective for promoting complex formation.

Among these, alkylenediamine having 8 or less carbon atoms in total in which one of two amino groups such as N,N-dimethylethylenediamine, N,N-diethylethylenediamine, N,N-dimethyl-1,3-propane diamine, N,N-diethyl-1,3-propane diamine, N,N-dimethyl-1,4-butanediamine, N,N-diethyl-1,4-butanediamine, N,N-dimethyl-1,6-hexanediamine, or the like is a primary amino group ($-NH_2$) and the other is a tertiary amino group ($-NR^1R^2$) is preferable. Preferable alkylenediamine is represented by the following structural formula.

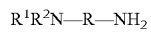

$R^1R^2N-R-NH_2$

Here, R represents a divalent alkylene group, and $R^1$ and $R^2$ may be the same or different and represent an alkyl group, provided that the sum of the number of carbon atoms of R, $R^1$, and $R^2$ is 8 or less. The alkylene group usually does not contain a heteroatom (an atom other than carbon and hydrogen) such as an oxygen atom or a nitrogen atom, but may have a substituent containing the heteroatom as necessary. In addition, the alkyl group usually does not contain a heteroatom such as an oxygen atom or a nitrogen atom, but may have a substituent containing the heteroatom as necessary.

When one of the two amino groups is a primary amino group, the ability to coordinate the silver compound to silver is increased, which is advantageous for complex formation; whereas, when the other amino group is a tertiary amino group, the ability of the tertiary amino group to coordinate to a silver atom is deteriorated, and thereby the complex formed is prevented from having a complicated network structure. When the complex has a complicated network structure, a high temperature may be required in the thermally decomposing of the complex. Furthermore, among these diamines, diamine having 6 or less carbon atoms in total is preferable, and diamine having 5 or less carbon atoms in total is more preferable from the viewpoint that the diamine can be removed from the surfaces of the silver particles in a short time even in low-temperature calcining. Only one kind of the aliphatic hydrocarbon diamine (3) may be used, or two or more kinds thereof may be used in combination.

In the present disclosure, the proportion of the aliphatic hydrocarbon monoamine (1) having 6 or more carbon atoms in total to any one or both of the aliphatic hydrocarbon monoamine (2) having 5 or less carbon atoms in total and the aliphatic hydrocarbon diamine (3) having 8 or less carbon atoms in total is not particularly limited. For example, the proportion may be, based on the total amines [(1)+(2)+(3)]:

from 5 mol % to 65 mol % of the aliphatic monoamine (1), and from 35 mol % to 95 mol % of the total amount of the aliphatic monoamine (2) and the aliphatic diamine (3). By setting the content of the aliphatic monoamine (1) to from 5 mol % to 65 mol %, a protective stabilizing function of the surfaces of silver particles to be generated is easily obtained by the carbon chain of the component (1). If the content of the component (1) is less than 5 mol %, the expression of the protective stabilizing function may be weak. On the other hand, when the content of the (1) component is greater than 65 mol %, the protective stabilizing function is sufficient, but the (1) component is hardly removed by low-temperature calcining. When the branched aliphatic monoamine is used as the component (1), the amount of the branched aliphatic monoamine may be from 10 mol % to 50 mol %, and thus the aliphatic monoamine (1): from 5 mol % to 65 mol % is satisfied.

When the aliphatic monoamine (1), plus both of the aliphatic monoamine (2) and the aliphatic diamine (3) are used, the proportion of these components is not particularly limited. For example, the proportion may be, based on the total amines [(1)+(2)+(3)]:

from 5 mol % to 65 mol % of the aliphatic monoamine (1), from 5 mol % to 70 mol % of the aliphatic monoamine (2), and from 5 mol % to 50 mol % of the aliphatic diamine (3). When the branched aliphatic monoamine is used as the component (1), the amount of the branched aliphatic monoamine may be from 10 mol % to 50 mol %, thereby satisfying from 5 mol % to 65 mol % of the aliphatic monoamine (1).

In this case, the lower limit of the content of the component (1) is preferably 10 mol % or more, and more preferably 20 mol % or greater. The upper limit of the content of the component (1) is preferably 65 mol % or less, and more preferably 60 mol % or less.

By setting the content of the aliphatic monoamine (2) to from 5 mol % to 70 mol %, a complex-forming promotion effect is easily obtained, the aliphatic monoamine (2) itself can contribute to low-temperature and short-time calcining, and the effect of assisting the removal of the aliphatic diamine (3) from the surface of silver particles during calcining is easily obtained. When the content of the component (2) is less than 5 mol %, the complex-forming promotion effect may be weak, or the component (3) may be hardly removed from the surfaces of silver particles during calcining. On the other hand, when the content of the component (2) exceeds 70 mol %, the complex-forming promotion effect is obtained, but the content of the aliphatic monoamine (1) is relatively reduced, and it is difficult to obtain the protective stabilization of the surface of the produced silver particles. The lower limit of the content of the component (2) is preferably 10 mol % or greater, and more preferably 15 mol % or greater. The upper limit of the content of the component (2) is preferably 65 mol % or less, and more preferably 60 mol % or less.

By setting the content of the aliphatic diamine (3) to from 5 mol % to 50 mol %, the complex-forming promotion effect and a complex thermal decomposing promotion effect are easily obtained, and since the protective film of the silver particles containing the aliphatic diamine (3) has high polarity, the dispersion stability of the silver particles in the dispersion medium containing a solvent having high polarity is improved. When the content of the component (3) is less than 5 mol %, the complex-forming promotion effect and the complex thermal decomposing promotion effect may be weak. On the other hand, when the content of the component (3) exceeds 50 mol %, the complex-forming promotion effect and the complex thermal decomposing promotion effect are obtained, but the content of the aliphatic monoamine (1) is relatively reduced, and it is difficult to obtain the protective stabilization of the surface of the produced silver particles. The lower limit of the content of the component (3) is preferably 5 mol % or greater, and more preferably 10 mol % or greater. The upper limit of the content of the component (3) is preferably 45 mol % or less, and more preferably 40 mol % or less.

When the aliphatic monoamine (1) and the aliphatic monoamine (2) are used (without using the aliphatic diamine (3)), the proportion of these components is not particularly limited. In consideration of the action of each of the above components, for example, the proportion may be, based on the total amines [(1)+(2)]:

from 5 mol % to 65 mol % of the aliphatic monoamine (1), and from 35 mol % to 95 mol % of the aliphatic monoamine (2). When the branched aliphatic monoamine is used as the component (1), the amount of the branched aliphatic monoamine may be from 10 mol % to 50 mol %, and thus the aliphatic monoamine (1): from 5 mol % to 65 mol % is satisfied.

When the aliphatic monoamine (1) and the aliphatic diamine (3) are used (without using the aliphatic monoamine (2)), the proportion of these components is not particularly limited. For example, the proportion may be, based on the total amines [(1)+(3)]:

from 5 mol % to 65 mol % of the aliphatic monoamine (1), and from 35 mol % to 95 mol % of the aliphatic diamine (3). When the branched aliphatic monoamine is used as the component (1), the amount of the branched aliphatic monoamine may be from 10 mol % to 50 mol %, thereby satisfying from 5 mol % to 65 mol % of the aliphatic monoamine (1).

These proportions of the aliphatic monoamine (1), the aliphatic monoamine (2), and/or the aliphatic diamine (3) are all examples, and various changes can be made.

In the present disclosure, when the aliphatic monoamine (2) and/or the aliphatic diamine (3) having high ability to coordinate the silver compound to silver are used, the amount of the aliphatic monoamine (1) having 6 or more carbon atoms in total deposited on the surfaces of silver particles can be reduced depending on the use proportion thereof. Therefore, even in the case of calcining at a low temperature in a short time, these aliphatic amine compounds are easily removed from the surfaces of the silver particles, and the sintering of the silver particles (A) sufficiently proceeds.

In the present disclosure, the total amount of the aliphatic hydrocarbon amine [for example, (1), (2), and/or (3)] is not particularly limited, and may be about 1 to 50 mol relative to 1 mol of silver atoms of the silver compound as a raw material. When the total amount [(1), (2), and/or (3)] of the amine component is less than 1 mol relative to 1 mol of the silver atom, there is a possibility that the silver compound that is not converted into the complex compound remains in the forming of a complex compound, and there is a possibility that the uniformity of the silver particles is impaired and the particles are enlarged in the subsequent thermally decomposing, or the silver compound remains without thermal decomposition. On the other hand, it is considered that there is little advantage even if the total amount [((1), (2), and/or (3))] of the amine components exceeds approximately 50 mol relative to 1 mol of the silver atoms. To prepare a dispersion of silver nanoparticles substantially in the absence of a solvent, the total amount of the amine component may be, for example, about 2 moles or greater. By setting the total amount of the amine component to from about 2 to 50 mol, the forming of a complex compound and thermally decomposing of a complex can be performed well. The lower limit of the total amount of the amine component is preferably 2 mol or greater, and more preferably 6 mol or more, relative to 1 mol of silver atoms of the silver compound. Note that the silver oxalate molecule contains two silver atoms.

In the present disclosure, to further improve the dispersibility of the silver particles (A) in the dispersion medium, aliphatic carboxylic acid (4) may be further used as a stabilizer. The aliphatic carboxylic acid (4) may be used together with the amines, and can be used by being contained in the amine mixed solution. By using the aliphatic carboxylic acid (4), the stability of the silver nanoparticles, particularly the stability in the state of a coating material dispersed in an organic solvent may be improved.

As the aliphatic carboxylic acid (4), saturated or unsaturated aliphatic carboxylic acid is used. Examples thereof include saturated aliphatic monocarboxylic acids having 4 or more carbon atoms, such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, and eicosenoic acid; and unsaturated aliphatic monocarboxylic acids having 8 or more carbon atoms, such as oleic acid, elaidic acid, linoleic acid, and palmitoleic acid.

Among them, saturated or unsaturated aliphatic monocarboxylic acids having from 8 to 18 carbon atoms are preferable. When the number of carbon atoms is 8 or more, a space between the silver particles and other silver particles can be secured when the carboxylic group is adsorbed on the surfaces of the silver particles, and thus the action of preventing aggregation of the silver particles is improved. In consideration of ease of obtaining, ease of removal during calcining, and the like, a saturated or unsaturated aliphatic monocarboxylic acid compound having up to 18 carbon atoms is usually preferable. Particularly, octanoic acid, oleic acid and the like are preferably used. Only one kind of the aliphatic carboxylic acids (4) may be used, or two or more kinds thereof may be used in combination.

When the aliphatic carboxylic acid (4) is used, it is preferable to use, for example, from about 0.05 to 10 mol, preferably from 0.1 to 5 mol, and more preferably from 0.5 to 2 mol, relative to 1 mol of silver atoms of the silver compound as a raw material. When the amount of the component (4) is less than 0.05 mol relative to 1 mol of the silver atoms, the effect of improving stability in a dispersion state by addition of the component (4) is weak. On the other hand, when the amount of the component (4) reaches 10 mol, the effect of improving stability in a dispersed state is saturated, and the component (4) is hardly removed by low-temperature calcining. However, in consideration of removal of the component (4) by low-temperature calcining, the aliphatic carboxylic acid (4) may not be used.

In the present disclosure, usually, a mixed solution containing each aliphatic hydrocarbon amine component, for example, a mixed solution containing the aliphatic monoamine (1) and one or both of the aliphatic monoamine (2) and the aliphatic diamine (3) is prepared [Preparing of amine mixed solution].

The amine mixed solution can be prepared by stirring the carboxylic acid component (4) at a predetermined proportion at room temperature in a case of using each of the amine components (1), (2) and/or component (3).

A complex compound containing the silver compound and the amine is produced by adding an aliphatic hydrocarbon amine mixed solution containing each amine component to the silver compound (or alcohol slurry thereof) [Forming of complex compound]. Each amine component may be sequentially added to the silver compound (or alcohol slurry thereof) without being used as a mixed solution.

The silver compound (or alcohol slurry thereof) and a predetermined amount of the amine mixed solution are mixed. The mixing may be performed at normal temperature. "Normal temperature" means 5° C. to 40° C. depending on the ambient temperature. For example, 5° C. to 35° C. (JIS Z 8703), 10° C. to 35° C., and 20° C. to 30° C. are intended. The temperature may be a normal room temperature (for example, in the range of 15° C. to 30° C.). Mixing at this time may be performed while stirring or since the coordination reaction of amines with a silver compound is accompanied by heat generation, it may be performed while appropriately cooling and stirring to be within the above temperature range, for example, to about 5° C. to 15° C. When the silver compound and the amine mixed solution are mixed in the presence of an alcohol having 3 or more carbon atoms, stirring and cooling can be performed satisfactorily. The excess of alcohol and amines serves as a reaction medium.

In the thermally decomposing method of the silver amine complex, in the related art, a liquid aliphatic amine component was charged into a reaction vessel, and a silver compound (silver oxalate) of a powder was introduced into the reaction vessel. The liquid aliphatic amine component is a flammable substance and there is a risk to the loading of the powder silver compound therein. That is, there is a risk of ignition due to static electricity due to charging of the silver compound of the powder. In addition, there is also a risk that a complex forming reaction locally proceeds and an exothermic reaction accidentally occurs due to the addition of the silver compound of the powder. Such a risk can be avoided when the silver compound and the amine mixed solution are mixed in the presence of the alcohol. It is therefore also safe for scaled-up industrial production.

Since the complex compound to be formed generally exhibits a color corresponding to the constituent components thereof, the end point of the forming reaction of the complex compound can be detected by detecting the end of the color change of the reaction mixture by an appropriate spectroscopic method or the like. In addition, the complex compound formed by silver oxalate is generally colorless (observed visually as white), but even in such a case, the formation state of the complex compound can be detected based on a morphological change such as a change in viscosity of the reaction mixture. For example, the time of the reaction to form the complex compound is from about 30 minutes to about 3 hours. In this way, a silver-amine complex is obtained in a medium primarily including alcohol and amines.

Next, the obtained complex compound is heated and thermally decomposed to form silver particles (A) [thermally decomposing of complex compound]. The silver particles (A) are formed without using a reducing agent. However, if necessary, an appropriate reducing agent may be used as long as the effect of the present disclosure is not impaired.

In such a metal-amine complex decomposition method, amines generally play a role of controlling a mode when atomic metals generated by decomposition of a metal compound are aggregated to form fine particles, and forming a film on the surface of the formed metal fine particles to prevent re-aggregation between the fine particles. That is, it is considered that by heating the complex compound of the metal compound and the amine, the metal compound is thermally decomposed while maintaining the coordination joint of the amine to the metal atom to produce an atomic metal, and then the metal atom to which the amine is coordinated is aggregated to form metal nanoparticles coated with the amine protective film.

The thermal decomposition at this time is preferably performed while stirring the complex compound in a reaction medium mainly containing alcohols (when used) and amines. The thermal decomposition is preferably performed within a temperature range in which the coated silver nanoparticles are formed, but is preferably performed at a temperature as low as possible within the temperature range from the viewpoint of preventing the elimination of the amine from the surface of the silver particles. In the case of a complex compound of silver oxalate, the compound can be, for example, about 80° C. to 120° C., preferably about 95° C. to 115° C., and more specifically about 100° C. to 110° C. In the case of a complex compound of silver oxalate, decomposition occurs and silver ions are reduced by heating at about 100° C., so that coated silver nanoparticles can be obtained. Note that, in general, the thermal decomposition of the silver oxalate itself occurs at about 200° C., and the reason why the thermal decomposition temperature is lowered by about 100° C. by forming a silver oxalate-amine complex compound is not clear, but it is presumed that a coordination polymer structure formed by pure silver oxalate is cut when a complex compound of silver oxalate and amine is formed.

In addition, the thermal decomposition of the complex compound is preferably performed in an inert gas atmosphere such as argon, but the thermal decomposition can also be performed in the atmosphere.

The thermal decomposition of the complex compound gives a suspension exhibiting a blue gloss. From this suspension, an operation of removing an excessive amount of amine or the like, for example, sedimentation of silver nanoparticles and a decantation and washing operation with an appropriate solvent (water or organic solvent) are performed to obtain desired stable silver particles (A) [Silver nanoparticle post-treatment]. After the washing operation, the powder is dried to obtain a desired stable powder of the silver particles (A). However, the wet silver nanoparticles (N) may be subjected to the preparation of an adhesive conductive paste.

Water or an organic solvent is used for the decantation and washing operation. Examples of the organic solvent include aliphatic hydrocarbon solvents such as pentane, hexane, heptane, octane, nonane, decane, undecane, dodecane, tridecane, and tetradecane; alicyclic hydrocarbon solvent such as cyclohexane; aromatic hydrocarbon solvents such as toluene, xylene, and mesitylene; alcohol solvent such as methanol, ethanol, propanol, and butanol; acetonitrile; and a mixed solvent thereof.

To avoid contamination of a solvent other than the compound (C) represented by Formula (I) in the adhesive conductive paste of the present disclosure, the compound (C) represented by Formula (I) may be used as the organic solvent for the decantation and washing operation. In addition, the decantation and washing operation may be performed using the compound (C) represented by Formula (I) after performing the decantation and washing operation using an organic solvent other than the compound (C) represented by Formula (I). In that case, to avoid contamination of the organic solvent other than the compound (C) represented by Formula (I), it is preferable to perform the decantation and washing operation multiple times (preferably from 2 to 4 times) with the compound (C) represented by Formula (I).

Since it is not necessary to use a reducing agent in the forming of silver nanoparticles of the present disclosure, there is no by-product derived from the reducing agent, the silver particles (A) are easily separated from the reaction system, and high-purity silver particles (A) are obtained. However, as necessary, an appropriate reducing agent may be used as long as the effect of the present disclosure is not impaired.

In this way, the silver particles (A) whose surfaces are coated with the protective agent used are formed. The protective agent contains, for example, the aliphatic monoamine (1), further contains one or both of the aliphatic monoamine (2) and the aliphatic diamine (3), and further contains the carboxylic acid (4) when used. The content proportion thereof in the protective agent is equivalent to the use proportion thereof in the amine mixed solution. The same applies to the silver particles (A).

As the silver particles (A), a commercially available product may be used, and for example, Low Viscosity-Type (silver concentration: from 30 to 50 mass %) of silver nano ink "Picosil (trade name)" available from Daicel Corporation may be used.

Silver Particle (B)

The average particle size (median diameter) of the silver particles (B) is from 0.1 to 10 μm, preferably from 0.1 to 9 μm, and more preferably 0.3 to 8 μm as described above. The average particle size (median diameter) of the silver particles (B) can be measured by a laser diffraction/scattering method.

Furthermore, the specific surface area of the silver particles (B) is, for example, from 0.5 to 4.0 $m^2/g$, preferably from 0.6 to 3.0 $m^2/g$, more preferably from 0.7 to 2.5 $m^2/g$, and even more preferably from 0.8 to 2.5 $m^2/g$. The specific surface area of the silver particles (B) can be measured by a BET method.

The proportion of the silver particles (B) in the total silver particles contained in the adhesive conductive paste of the present disclosure is, for example, 40 wt. % or greater, preferably 50 wt. % or greater, and more preferably 60 wt. % or greater. When the content of the silver particles (B) is within the above-mentioned range, it is preferable from the viewpoint of being able to form a high joining strength between the substrate and the electronic element by sintering fast even under an inert gas atmosphere such as nitrogen. On the other hand, the proportion of the silver particles (B) is, for example, 99 wt. % or less, preferably 97 wt. % or less, and more preferably 95 wt. % or less.

In the silver particles (B), it is particularly preferable to use silver particles (group) having different average particle sizes in combination from the viewpoint of being able to form conductive wiring and a joined structure having a lower electric resistance value and excellent electrical characteristics, and it is preferable to use silver particles (group) having an average particle size from 0.1 to 1.5 μm (more preferably from 0.1 to 0.6 μm) and silver particles (group) having an average particle size from greater than 1.5 μm and 8 μm or less (more preferably from 5 to 8 μm) in combination at a proportion from, for example, 70/30 to 30/70, preferably from 40/60 to 60/40, more preferably from 45/55 to 55/45 (former/latter: weight proportion).

The content of the silver particles (B) is, for example, from 20 to 95 wt. %, preferably from 30 to 90 wt. %, and more preferably from 40 to 90 wt. % of the total amount of the adhesive conductive paste in that a sintered body having good conductivity can be obtained, that dispersion stability is excellent (that is, high dispersibility can be stably maintained over a long period of time, and an increase in viscosity can be suppressed), that a substrate and an electronic element can be sintered fast even in an inert gas atmosphere such as nitrogen to form a high joining strength.

Examples of the shape of the silver particles (B) include a spherical shape, a flat shape, and a polyhedron, and conductive particles having different shapes may be used in combination, or only conductive particles having the same shape may be used.

As the silver particles (B), a commercially available product may be used, and for example, a trade name "AgC-239" (average particle size (median diameter): 6.0 μm, available from Fukuda Metal Foil & Powder Co., Ltd.), a trade name "S211A-10" (Average particle size (median diameter): 0.54 μm, available from Daiken Chemical Co., Ltd.), and the like can be used.

The adhesive conductive paste of the present disclosure may contain conductive particles (hereinafter, the conductive particles may be referred to as "other conductive particles") other than the silver particles (A) and the silver particles (B), and the content of the silver particles is, for example, 75 wt. % or greater, preferably 80 wt. % or greater, more preferably 85 wt. % or greater, and still more preferably 90 wt. % or greater of the total amount of the conductive particles contained in the adhesive conductive paste of the present disclosure. The upper limit of the content of the silver particles is 100 wt. %. Therefore, the content of the other conductive particles is, for example, 25 wt. % or less, preferably 20 wt. % or less, more preferably 15 wt. % or less, still more preferably 10 wt. % or less, and even more preferably 5 wt. % or less of the total amount of the conductive particles contained in the adhesive conductive paste of the present disclosure. When the silver particles are contained in the above range, it is preferable from the viewpoint that conductive wiring and a joined structure which are particularly excellent in the electrical characteristics can be formed.

When other conductive particles are contained, the weight ratio of the silver particles contained in the adhesive conductive paste of the present disclosure to other conductive particles (former:latter) is, for example, from 4:1 to 30:1, preferably from 6:1 to 25:1, and more preferably from 8:1 to 20:1.

Examples of the other electrically conductive particles include palladium, platinum, gold, copper, and nickel. One of these can be used alone or two or more in combination.

Adhesive Conductive Paste

The adhesive conductive paste of the present disclosure contains silver particles (A) and silver particles (B) as conductive particles, and a compound represented by Formula (I) as a solvent.

The content of the solvent (the total content when two or more kinds are contained) in the total amount (100 wt. %) of the adhesive conductive paste of the present disclosure is, for example, from 1 to 50 wt. %, preferably from 2 to 40 wt. %, and more preferably from 3 to 30 wt. %.

In addition, the content of the compound (C) represented by Formula (I) (the total content when two or more kinds are contained) in the total amount (100 wt. %) of the adhesive conductive paste of the present disclosure is, for example, from 1 to 50 wt. %, preferably from 2 to 40 wt. %, and more preferably from 3 to 30 wt. %.

Further, the content of the conductive particles (the total content when two or more kinds are contained) in the total amount (100 wt. %) of the adhesive conductive paste of the present disclosure is, for example, from 50 to 99 wt. %, preferably from 60 to 97 wt. %, and more preferably from 70 to 95 wt. %.

Further, the content of the silver particles (total content of silver particles (A) and (B)) in the total amount (100 wt. %) of the adhesive conductive paste of the present disclosure is, for example, from 50 to 99.8 wt. %, preferably from 60 to 97 wt. %, and more preferably from 70 to 95 wt. %.

The proportion of the total content of the compound (C) represented by Formula (I) and the silver particles in the total amount (100 wt. %) of the adhesive conductive paste of the present disclosure is, for example, 70 wt. % or greater, preferably 80 wt. % or greater, and more preferably 90 wt. % or greater. Accordingly, the content of the compound (C) represented by Formula (I) and the components other than silver particles (the total content when two or more kinds are contained) contained in the adhesive conductive paste of the present disclosure is, for example, 30 wt. % or less, preferably 20 wt. % or less, and more preferably 10 wt. % or less.

Furthermore, the content of the organic component in the total amount (100 wt. %) of the adhesive conductive paste of the present disclosure is, for example, 15 wt. % or less and preferably 13 wt. % or less. The organic component includes the compound (C) represented by Formula (I), and may also include other solvents or organic additives (adhesives, thickeners, binders, and the like).

Since the adhesive conductive paste of the present disclosure contains the silver particles (A) and the silver particles (B), it is possible to form a conductive wiring and a joined structure which are highly accurate and capable of connecting a substrate and an electronic element with high joining strength by sintering fast even in an inert gas atmosphere such as nitrogen.

The compound represented by Formula (I) contained in the adhesive conductive paste of the present disclosure has a low volatilization rate at a printing temperature and a high volatilization rate at a sintering temperature. Therefore, when the adhesive conductive paste of the present disclosure is used, it is possible to suppress the fluctuations in viscosity during printing and to perform printing without unevenness. Furthermore, during the sintering, a sintered body having excellent joining strength can be formed even at low temperatures (for example, 150° C. or higher, lower than 300° C., and preferably 170° C. to 280° C.) in an inert gas atmosphere such as nitrogen (sintering time can be, for example, from 0.1 to 2 hours, and preferably from 0.5 to 1.5 hours), and it is possible to prevent deterioration or damage to a substrate during the sintering.

The adhesive conductive paste of the present disclosure is applied to a substrate by a printing method (specifically, a dispenser printing method, a mask printing method, a screen printing method, an inkjet printing method, and the like are used) or the like, and then sintered to form a conductive wiring and a joined structure.

The sintering temperature is, for example, 150° C. or higher, less than 300° C., and preferably 160° C. to 280° C. The sintering time is, for example, 0.1 to 2 hours, and preferably 0.5 to 1.5 hours.

The sintering is preferably performed in an inert gas atmosphere such as a nitrogen atmosphere or an argon atmosphere from the viewpoint of being able to prevent oxidation of copper, a nickel substrate, or wiring, which is not plated and protected in the semiconductor module, by oxygen in the atmosphere.

The thickness of the adhesive conductive paste of the present disclosure applied onto the substrate is in a range such that a thickness of the conductive wiring and the joined structure formed by the above method is, for example, from 15 to 400 µm, preferably from 20 to 250 µm, and more preferably from 40 to 180 µm.

Examples of the substrate on which the conductive wiring and the joined structure are formed include a ceramic substrate, an SiC substrate, a gallium nitride substrate, a metal substrate, a glass epoxy substrate, a BT resin substrate, a glass substrate, and a resin substrate. Since the adhesive conductive paste of the present disclosure can be sintered at a low temperature as described above, a substrate weak to heat can also be used.

The shape of the conductive wiring and the joined structure is not particularly limited as long as the conductive wiring and the joined structure have a shape capable of connecting electronic elements.

In addition, the adhesive conductive paste of the present disclosure may contain an adhesive (for example, a polymer compound having a molecular weight of 10,000 or more, such as an epoxy resin, a silicone resin, or an acrylic resin), and the content thereof is, for example, 10 wt. % or less, preferably 5 wt. % or less, more preferably 1 wt. % or less, and still more preferably 0.5 wt. % or less of the total amount (100) of the adhesive conductive paste. Therefore, according to the adhesive conductive paste of the present disclosure, an adhesive or a non-conductive component derived from the adhesive does not inhibit interaction between conductive particles or between conductive particles and a substrate, and a conductive wiring or a joined structure [the electric resistance value is, for example, $10 \times 10^{-6}$ Ω·cm or less, preferably $9.0 \times 10^{-6}$ Ω·cm or less, more preferably $8.5 \times 10^{-6}$ Ω·cm or less, and still more preferably $7.0 \times 10^{-6}$ Ω·cm or less] having excellent conductivity can be formed.

Furthermore, in the conductive wiring and the joined structure formed on the substrate using the adhesive conductive paste of the present disclosure, conductive particles are densely assembled by sintering, and the conductive particles are melted with each other, and thus the excellent joining strength can be exhibited to the substrate. For example, the joining strength to a silver-plated copper substrate (in accordance with JIS Z 3198) is 10 MPa or greater, and preferably 20 MPa or greater.

Since the adhesive conductive paste of the present disclosure has the above characteristics, for example, the adhesive conductive paste can be suitably used for the purpose of manufacturing an electronic component (for example, a power semiconductor module, an LED module, or the like) using a printing method.

EXAMPLES

Hereinafter, the present disclosure will be described in more detail based on examples, but the present disclosure is not limited by these examples at all.

Hereinafter, the average particle size (median diameter) of the silver particles (A) was measured by the following method.

The dispersion of silver particles (A) was observed with a transmission electron microscope (TEM). The number of observation was 100000 times and 4 fields×50. In addition, the observation site was a site where large and small particles coexisted. The number particle size distribution was obtained by analyzing the image. Using a known conversion formula for this number particle size distribution, the particles were converted to a volume particle size distribution on the assumption that the aspect ratio was 1. The average particle size (median diameter) was determined from the particle size distribution.

Furthermore, the average particle size (median diameter) of the silver particles (B) is a value measured by a laser diffraction/scattering method.

The silver particles and the solvent used are as follows.
Silver Particle (A)
　"nAg": Average particle size (median diameter): 40 nm, available from Daicel Corporation
Silver Particle (B)
　"AgC-239": Average particle size (median diameter): 6.0 µm, available from Fukuda Metal Foil & Powder Co., Ltd.
　"S211A-10": Average particle size (median diameter) 0.54 µm, available from Daiken Chemical Co., Ltd.
[Solvent (Compound (C))]
　Tripropylene glycol methyl ether: Boiling point 242° C., available from Daicel Corporation
　Dipropylene glycol n-butyl ether: Boiling point 229° C., available from Daicel Corporation
　Dipropylene glycol n-propyl ether: Boiling point 212° C., available from Daicel Corporation
　Tripropylene glycol methyl n-propyl ether: Boiling point 258° C., available from Daicel Corporation
　Diethylene glycol monobutyl ether: Boiling point 230° C., available from Daicel Corporation
　Diethylene glycol monomethyl ether: Boiling point 193° C., available from Daicel Corporation
　Diethylene glycol monoethyl ether: Boiling point 196° C., available from Daicel Corporation
　Diethylene glycol monoethyl ether acetate: Boiling point 218° C., available from Daicel Corporation
　Diethylene glycol monobutyl ether acetate: Boiling point 247° C., available from Daicel Corporation
　Ethylene glycol monobutyl ether acetate: Boiling point 192° C., available from Daicel Corporation
　Ethylene glycol monohexyl ether: Boiling point 205° C., available from Daicel Corporation
　Dipropylene glycol methyl ether acetate: Boiling point 213° C., available from Daicel Corporation Example 1

Diethylene glycol monobutyl ether as a solvent ($C_1$) in an amount of 50 g was added to 10 g of methanol slurry of nAg, and the resulting mixture was separated into a solvent component and wet powder of nAg by centrifugation.

The solvent component was discarded, 50 g of diethylene glycol monobutyl ether was added to and dispersed in the wet powder, and then the solvent component and nAg were separated into wet powder by centrifugation. This operation was repeated three times to obtain nAg wet powder of diethylene glycol monobutyl ether. The wet powder was heated to 400° C. with TG-DTA, and the weight of the contained diethylene glycol monobutyl ether was calculated from the weight loss. The diethylene glycol monobutyl ether content in the wet powder was 14.5 wt. %.

Thereafter, 80 parts of AgC-239, 23.4 parts of nAg wet powder (20 parts of nAg, 3.4 parts of diethylene glycol monobutyl ether: from the value calculated from the above TG-DTA), and 8 parts of tripropylene glycol methyl n-propyl ether as a solvent (C2) were mixed with a rotating and revolving mixer to obtain an adhesive conductive paste containing nAg and AgC-239.

Examples 1 to 40

An adhesive conductive paste was obtained in the same manner as in Example 1 except that the blending amounts of the silver particles (A), the silver particles (B), the solvent (C1), and the solvent (C2) were set as shown in Tables 1 to 6.

Comparative Example 1

100 parts of AgC-239 and 10 parts of dipropylene glycol n-propyl ether as a solvent (C2) were mixed with a rotation-revolution mixer to obtain an adhesive conductive paste containing AgC-239.

Comparative Examples 2 to 7

An adhesive conductive paste was obtained in the same manner as in Comparative Example 1 except that the blending amounts of the silver particles (B) and the solvent (C2) were set as shown in Tables 1 to 6.
(Evaluation of Metal Mask Printability and Joining Strength)

The substrate, mask, and equipment used are as follows.
Substrate
　Silver plated substrate (available from Nippon Testpanel Co., Ltd.)
　Substrate: Copper (1.0 mm×9 mm×60 mm)
　Base: Electroless nickel plating (5 µm)
　Outermost surface: Semi-gloss silver plating (1.0 µm)
　Gold plated substrate (available from Nippon Testpanel Co., Ltd.) (Examples 32 to 35, Comparative Example 5 only)
　Substrate: Copper (1.0 mm×9 mm×60 mm)
　Base: Electroless nickel plating (5 µm)
　Outermost surface: Semi-gloss silver plating (1.0 µm)
　Silicon chip (available from YAMANAKA HUTEC CORPORATION)
　Silicon (0.525 mm×3 mm×3 mm)
　Base: Titanium 500 nm sputter
　Outermost surface: Silver 2 µm sputter
Mask
　Metal mask (available from TOWA-TECH CORPORATION)
　3 mm×3 mm, mesh thickness 100 µm
Equipment
　Chip mounter
　SMT-64H (available from Okuhara Electric Co., Ltd.)
　Sintering furnace (reflow furnace)
　RSS-450-210-FA (available from UNITEMP)

The adhesive conductive pastes obtained in the above examples and comparative examples were applied to the substrate (1) by a metal mask printing method to form a coating film (coating film thickness: about 100 µm). The metal mask printability was evaluated based on the following criteria. The results are shown in Tables 1 to 4.
　The coating film does not ooze out from the substrate on any of the silver-plated substrate, the gold-plated substrate, and the silicon chip . . . Good
　The coating film oozes out from the substrate on any of the silver-plated substrate, the gold-plated substrate, and the silicon chip . . . Poor Next, the same substrate (2) as the substrate (1) was placed on the formed coating film, and heated and sintered under the following conditions using a reflow furnace to prepare a sample (substrate (1)/sintered adhesive conductive paste/substrate (2)).
　Under atmosphere (Examples 1 to 35 and 40, and Comparative Examples 1 to 5 and 7):
　25° C.→180° C. (heating rate: 15° C./min)
　Maintained at 180° C. for 60 min
　Under atmosphere (Examples 36 to 39, Comparative Example 6)
　25° C.→160° C. (heating rate: 15° C./min)
　Maintained at 160° C. for 60 min Under a nitrogen atmosphere (Examples 1 to 31, Comparative Examples 1 to 4):
25° C.→250° C. (heating rate: 15° C./min)
Maintained at 250° C. for 60 min
Under a nitrogen atmosphere (Example 40, Comparative Example 7):
25° C.→180° C. (heating rate: 15° C./min)
Maintained at 180° C. for 60 min
With respect to the obtained sample (n=4), the joining strength between the substrate (1) and the substrate (2) was measured under the following conditions at room temperature using a Daicel-Tester SERIES 4000 (available from DAGE) to evaluate joinability. An average value of the joining strength (MPa) in the case of using a silver-plated base material, a gold-plated base material (Examples 32 to 35 and Comparative Example 5 only), and a silicon chip as the substrate is shown in Tables 1 to 5.

Test Speed: 50 μm/s
Test Height: 50 μm

TABLE 1

|  |  | Example 1 | Example 2 | Example 3 | Example 4 | Example 5 | Example 6 | Example 7 | Example 8 | Example 9 | Example 10 | Comparative Example 1 | Comparative Example 2 |
|---|---|---|---|---|---|---|---|---|---|---|---|---|---|
| (A) | nAg | 20 | 20 | 20 | 20 | 20 | 20 | 20 | 20 | 20 | 20 |  |  |
| (B) | AgC-239 | 80 | 80 | 80 | 30 | 80 | 80 | 80 | 80 | 80 | 80 | 100 | 100 |
| (C1) | Diethylene glycol monobutyl ether | 3.4 |  |  |  |  |  |  |  |  |  |  |  |
|  | Diethylene glycol monomethyl ether |  | 4.7 |  |  |  |  |  |  |  |  |  |  |
|  | Diethylene glycol monoethyl ether |  |  | 3.6 |  |  |  |  |  |  |  |  |  |
|  | Diethylene glycol monoethyl ether acetate |  |  |  | 4 |  |  |  |  |  |  |  |  |
|  | Diethylene glycol monobutyl ether acetate |  |  |  |  | 3.9 |  |  |  |  |  |  |  |
|  | (mono)ethylene glycol monobutyl ether acetate |  |  |  |  |  | 3.3 |  |  |  |  |  |  |
|  | Ethylene glycol monohexyl ether |  |  |  |  |  |  | 3.1 |  |  |  |  |  |
|  | Tripropylene glycol methyl ether |  |  |  |  |  |  |  | 4 |  |  |  |  |
|  | Dipropylene glycol n-butyl ether |  |  |  |  |  |  |  |  | 3.4 |  |  |  |
|  | Dipropylene glycol n-propyl ether |  |  |  |  |  |  |  |  |  | 3.3 |  |  |
| (C2) | Tripropylene glycol methyl n-propyl ether | 8 | 8 | 8 | 8 | 8 | 8 | 8 | 8 | 8 | 8 | 10 |  |
|  | Dipropylene glycol n-propyl ether |  |  |  |  |  |  |  |  |  |  |  | 10 |
| Metal mask printability |  | Good | Good | Good | Good | Good | Good | Good | Good | Good | Good | Poor | Poor |
| Joining strength (MPa) | Atmospheric sintering (unpressurized 180° C., 60 min) | 27.1 | 27.3 | 28.0 | 26.6 | 21.4 | 29.5 | 45.8 | 41.7 | 33.5 | 34.9 | 21.3 | 23.6 |
|  | Under nitrogen atmosphere (unpressurized 250° C. 60 min) | 30.8 | 26.9 | 30.7 | 27.9 | 26.3 | 29.8 | 27.5 | 30.3 | 32.5 | 32.8 | 8.2 | 7.2 |

TABLE 2

|  |  | Example 11 | Example 12 | Example 13 | Example 14 | Example 15 | Example 16 | Example 17 | Example 18 | Example 19 |
|---|---|---|---|---|---|---|---|---|---|---|
| (A) | nAg | 20 | 20 | 20 | 20 | 20 | 20 | 20 | 20 | 20 |
| (B) | AgC-239 | 40 | 40 | 40 | 40 | 40 | 40 | 40 | 40 | 40 |
|  | S211A-10 | 40 | 40 | 40 | 40 | 40 | 40 | 40 | 40 | 40 |
| (C1) | Diethylene glycol monobutyl ether | 3.4 |  |  |  |  |  |  |  |  |
|  | Diethylene glycol monomethyl ether |  | 4.7 |  |  |  |  |  |  |  |
|  | Diethylene glycol monoethyl ether |  |  | 3.6 |  |  |  |  |  |  |

TABLE 2-continued

|  |  | | | | | | | | | |
|---|---|---|---|---|---|---|---|---|---|---|
|  | Diethylene glycol monoethyl ether acetate |  |  | 4 |  |  |  |  |  |  |
|  | Diethylene glycol monobutyl ether acetate |  |  |  | 3.9 |  |  |  |  |  |
|  | (mono)ethylene glycol monobutyl ether acetate |  |  |  |  | 3.3 |  |  |  |  |
|  | Ethyleneglycol monohexyl ether |  |  |  |  |  | 3.1 |  |  |  |
|  | Tripropylene glycol methyl ether |  |  |  |  |  |  | 4 |  |  |
|  | Dipropylene glycol n-butyl ether |  |  |  |  |  |  |  |  | 3.4 |
|  | Dipropylene glycol n-propyl ether |  |  |  |  |  |  |  |  |  |
|  | Dipropylene glycol methyl ether acetate |  |  |  |  |  |  |  |  |  |
| (C2) | Tripropylene glycol methyl n-propyl ether | 5 | 5 | 5 | 5 | 5 | 5 | 5 | 5 | 5 |
|  | Tripropylene glycol methyl ether |  |  |  |  |  |  |  |  |  |
|  | Dipropylene glycol n-propyl ether |  |  |  |  |  |  |  |  |  |
|  | Dipropylene glycol methyl ether acetate |  |  |  |  |  |  |  |  |  |
| Metal mask printability | | Good | Good | Good | Good | Good | Good | Good | Good | Good |
| Joining strength (MPa) | Atmospheric sintering (unpressurized 180° C., 60 min) | 33.5 | 32.3 | 34.3 | 56.0 | 51.3 | 78.7 | 49.5 | 53.2 | 58.7 |
|  | Under nitrogen atmosphere (unpressurized 250° C. 60 min) | 43.2 | 42.6 | 29.1 | 40.1 | 31.6 | 26.9 | 40.5 | 28.5 | 40.3 |

|  |  | Example 20 | Example 21 | Example 22 | Example 23 | Example 24 | Example 25 | Comparative Example 3 | Comparative Example 4 |
|---|---|---|---|---|---|---|---|---|---|
| (A) | nAg | 20 | 20 | 20 | 20 | 20 | 20 |  |  |
| (B) | AgC-239 | 40 | 40 | 40 | 40 | 40 | 40 | 50 | 50 |
|  | S211A-10 | 40 | 40 | 40 | 40 | 40 | 40 | 50 | 50 |
| (C1) | Diethylene glycol monobutyl ether |  |  |  |  |  |  |  |  |
|  | Diethylene glycol monomethyl ether |  |  |  |  |  |  |  |  |
|  | Diethylene glycol monoethyl ether |  |  |  |  |  |  |  |  |
|  | Diethylene glycol monoethyl ether acetate |  |  |  |  |  |  |  |  |
|  | Diethylene glycol monobutyl ether acetate |  |  |  |  |  |  |  |  |
|  | (mono)ethylene glycol monobutyl ether acetate |  |  |  |  |  |  |  |  |
|  | Ethyleneglycol monohexyl ether |  |  |  |  |  |  |  |  |
|  | Tripropylene glycol methyl ether |  |  |  |  |  |  |  |  |
|  | Dipropylene glycol n-butyl ether |  |  |  |  |  |  |  |  |
|  | Dipropylene glycol n-propyl ether | 3.5 | 3.5 | 3.5 |  |  |  |  |  |
|  | Dipropylene glycol methyl ether acetate |  |  |  | 3.3 | 3.3 | 3.3 |  |  |

TABLE 2-continued

| | | | | | | | | | |
|---|---|---|---|---|---|---|---|---|---|
| (C2) | Tripropylene glycol methyl n-propyl ether | 5 | | | | | | 8.5 | |
| | Tripropylene glycol methyl ether | | 5 | 5 | | | | | |
| | Dipropylene glycol n-propyl ether | | | 5 | | | 5 | | |
| | Dipropylene glycol methyl ether acetate | | | | 5 | | | | 8.5 |
| Metal mask printability | | Good | Good | Good | Good | Good | Good | Poor | Poor |
| Joining strength (MPa) | Atmospheric sintering (unpressurized 180° C., 60 min) | 66.9 | 50.1 | 52.7 | 46.2 | 39.0 | 41.4 | 29.0 | 32.6 |
| | Under nitrogen atmosphere (unpressurized 250° C. 60 min) | 46.0 | 52.6 | 36.9 | 39.2 | 36.6 | 44.3 | 13.2 | 10.3 |

TABLE 3

| | | Example 26 | Example 27 | Example 14 | Example 28 | Example 29 | Example 30 | Example 22 | Example 31 | Comparative Example 3 | Comparative Example 4 |
|---|---|---|---|---|---|---|---|---|---|---|---|
| (A) | nAg | 5 | 10 | 20 | 40 | 5 | 10 | 20 | 40 | | |
| (B) | AgC-239 | 47.5 | 45 | 40 | 30 | 47.5 | 45 | 40 | 30 | 50 | 50 |
| | S211A-10 | 47.5 | 45 | 40 | 30 | 47.5 | 45 | 40 | 30 | 50 | 50 |
| (C1) | Diethylene glycol monoethyl ether acetate | 1 | 2 | 4 | 8 | | | | | | |
| | Dipropylene glycol n-propyl ether | | | | | 0.9 | 1.8 | 3.5 | 7 | | |
| (C2) | Tripropylene glycol methyl n-propyl ether | 8 | 7 | 5 | 1 | | | | | 8.5 | |
| | Dipropylene glycol n-propyl ether | | | | | 7.8 | 6.7 | 5 | 1.5 | | 8.5 |
| Metal mask printability | | Good | Good | Good | Good | Good | Good | Good | Good | Poor | Poor |
| Joining strength (MPa) | Atmospheric sintering (unpressurized 180° C., 60 min) | 59.8 | 50.5 | 56.0 | 48.2 | 43.7 | 44.8 | 52.7 | 42.7 | 29.0 | 32.6 |
| | Under nitrogen atmosphere (unpressurized 250° C. 60 min) | 25.3 | 47.2 | 40.1 | 31.0 | 27.4 | 40.0 | 36.9 | 29.7 | 13.2 | 10.3 |

TABLE 4

| | | Example 32 | Example 33 | Example 34 | Example 35 | Comparative Example 5 |
|---|---|---|---|---|---|---|
| (A) | nAg | 20 | 20 | 20 | 20 | |
| (B) | AgC-239 | 40 | 40 | 40 | 40 | 50 |
| | S211A-10 | 40 | 40 | 40 | 40 | 50 |
| (C1) | (mono)ethylene glycol monobutyl ether acetate | 3.3 | | | | |
| | Tripropylene glycol methyl ether | 4 | | | | |
| | Dipropylene glycol n-butyl ether | | 3.4 | | | |
| | Dipropylene glycol n-propyl ether | | | 3.5 | | |
| (C2) | Tripropylene glycol methyl n-propyl ether | | | | 5 | |
| | Dipropylene glycol n-propyl ether | | 5 | 5 | 5 | 8.5 |
| Metal mask printability | | Good | Good | Good | Good | Poor |
| Joining strength (MPa) | Atmospheric sintering (unpressurized 180° C., 60 min) | 40.4 | 38.2 | 36.5 | 43.1 | 17.2 |

TABLE 5

| | | Example 36 | Example 37 | Example 38 | Example 39 | Comparative Example 6 |
|---|---|---|---|---|---|---|
| (A) | nAg | 20 | 20 | 20 | 20 | |
| (B) | AgC-239 | 40 | 40 | 40 | 40 | 50 |
| | S211A-10 | 40 | 40 | 40 | 40 | 50 |
| (C1) | (mono)ethylene glycol monobutyl ether acetate | 3.3 | | | | |
| | Tripropylene glycol methyl ether | | 4 | | | |
| | Dipropylene glycol n-butyl ether | | | 3.4 | | |
| | Dipropylene glycol n-propyl ether | | | | 3.5 | |
| (C2) | Tripropylene glycol methyl n-propyl ether | 5 | | | | |
| | Dipropylene glycol n-propyl ether | | 5 | 5 | 5 | 8.5 |

TABLE 5-continued

|  |  | Example 36 | Example 37 | Example 38 | Example 39 | Comparative Example 6 |
|---|---|---|---|---|---|---|
| Joining strength (MPa) | Atmospheric sintering (unpressurized 160° C., 60 min) | 30.7 | 33.1 | 32.3 | 34.6 | 5.3 |

The adhesive conductive pastes of examples in which the silver particles (A) were blended had good mask printability, whereas the adhesive conductive pastes of comparative examples in which the silver particles (A) were not blended had poor mask printability. In addition, the joining strength of the adhesive conductive paste of the comparative example in which the silver particles (A) were not blended was significantly reduced under a nitrogen atmosphere, whereas the adhesive conductive paste of example in which the silver particles (A) were blended exhibited good joining strength even under a nitrogen atmosphere.

The joining strength of each of the adhesive conductive pastes of Example 40 and Comparative Example 7 was evaluated in the same manner as described above except that the sintering time (holding time) was 10 minutes, 20 minutes, 30 minutes, and 60 minutes. The results are shown in Table 6.

TABLE 6

|  |  | Example 40 | | | | Comparative Example 7 | | | |
|---|---|---|---|---|---|---|---|---|---|
| (A) | nAg | 20 | | | | | | | |
| (B) | AgC-239 | 40 | | | | 50 | | | |
|  | S211A-10 | 40 | | | | 50 | | | |
| (C1) | Dipropylene glycol n-propyl ether | 3.5 | | | | | | | |
| (C2) | Dipropylene glycol n-propyl ether | 5 | | | | 8.5 | | | |
|  | Sintering time | 10 | 20 | 30 | 60 | 10 | 20 | 30 | 60 |
| Joining strength (MPa) | Atmospheric sintering (unpressurized 180° C.) | 33.2 | 34.4 | 34.7 | 55.2 | 1.0 | 5.2 | 29.7 | 32.6 |
|  | Under nitrogen atmosphere (unpressurized 180° C.) | 32.7 | 41.8 | 43.5 | 48.1 | 0.7 | 0.7 | 0.9 | 1.0 |

The adhesive conductive pastes of examples in which the silver particles (A) were blended exhibited good joining strength even when the sintering time was shortened. On the other hand, in the adhesive conductive paste of comparative example in which the silver particles (A) were not blended, when the sintering time was shortened, the joining strength was significantly reduced even in the atmosphere.

Each aspect disclosed in the present specification can be combined with any other feature disclosed herein.

Note that each of the configurations, combinations thereof, and the like in each of the embodiments are an example, and various additions, omissions, substitutions, and other changes may be made as appropriate without departing from the spirit of the present disclosure. The present disclosure is not limited by the embodiments and is limited only by the claims.

Variations of embodiments of the present disclosure described above are additionally described below.

[1] An adhesive conductive paste for forming a conductive wiring and/or a joined structure to connect an electronic element, the adhesive conductive paste including a conductive particle and a solvent, wherein the conductive paste including a silver particle (A) having an average particle size of 1 nm or greater and less than 100 nm and a silver particle (B) having an average particle size of 0.1 μm or greater and 10 μm or less, the silver particle (A) being a silver nanoparticle having a configuration in which a surface is coated with a protective agent containing amine, and wherein the solvent includes a compound (C) that is represented by Formula (I) below:

$$R^a\text{—}O\text{—}(X\text{—}O)_n\text{—}R^b \quad (I)$$

where in Formula (I), $R^a$ represents a monovalent group selected from a hydrocarbon group having from 1 to 6 carbon atom(s) and an acyl group, X represents a divalent group selected from a hydrocarbon group having from 2 to 6 carbon atoms, $R^b$ represents a hydrogen atom or a monovalent group selected from a hydrocarbon group having from 1 to 6 carbon atom(s) and an acyl group, $R^a$ and $R^b$ may be the same, and n represents an integer from 1 to 3.

[2] The adhesive conductive paste according to [1], wherein the silver particle (A) has an average particle size (median diameter) from 0.5 to 90 nm (preferably from 1 to 80 nm, and more preferably from 1 to 75 nm).

[3] The adhesive conductive paste according to [1] or [2], wherein the silver particle (A) is contained at a proportion of 50 wt. % or less (preferably 45 wt. % or less, and more preferably 40 wt. % or less) out of all silver particles contained in the adhesive conductive paste.

[4] The adhesive conductive paste according to any one of [1] to [3], wherein the silver particle (A) is contained at a proportion of 1 wt. % or greater (preferably 3 wt. % or greater, and more preferably 4 wt. % or greater) out of all silver particles contained in the adhesive conductive paste.

[5] The adhesive conductive paste according to any one of [1] to [4], wherein the silver particle (A) is contained in an amount from 1 to 45 wt. % (preferably from 2 to 43 wt. %, more preferably from 3 to 40 wt. %) relative to a total amount (100 wt. %) of the adhesive conductive paste.

[6] The adhesive conductive paste according to any one of [1] to [5], wherein the protective agent in the silver particle (A) contains, as the amine, an aliphatic hydrocarbon monoamine (1) including an aliphatic hydrocarbon group and one amino group, the aliphatic hydrocarbon group having 6 or greater carbon atoms in total, and the protective agent further contains at least one of an aliphatic hydrocarbon monoamine (2) or an aliphatic hydrocarbon diamine (3), the aliphatic hydrocarbon monoamine (2) including an aliphatic hydrocarbon group and one amino group, the aliphatic hydrocarbon group having 5 or less carbon atoms in total, and the aliphatic hydrocarbon diamine (3) including an aliphatic hydrocarbon group and two amino groups, the aliphatic hydrocarbon group having 8 or less carbon atoms in total.

[7] The adhesive conductive paste according to [6], wherein a proportion of the aliphatic hydrocarbon monoamine (1) to any one or both of the aliphatic hydrocarbon monoamine (2) and the aliphatic hydrocarbon diamine (3) is, based on the total amines [(1)+(2)+(3)]:
from 5 mol % to 65 mol % of the aliphatic monoamine (1), and
from 35 mol % to 95 mol % of the total amount of the aliphatic monoamine (2) and the aliphatic diamine (3).

[8] The adhesive conductive paste according to [6], wherein in a case where the aliphatic monoamine (1), plus both of the aliphatic monoamine (2) and the aliphatic diamine (3) are used, a proportion of these components is, based on the total amines [(1)+(2)+(3)]:
from 5 mol % to 65 mol % of the aliphatic monoamine (1)
from 5 mol % to 70 mol % of the aliphatic monoamine (2), and
from 5 mol % to 50 mol % of the aliphatic diamine (3).

[9] The adhesive conductive paste according to [6], wherein in a case where the aliphatic monoamine (1) and the aliphatic monoamine (2) are used (without using the aliphatic diamine (3)), a proportion of these components is, based on the total amines [(1)+(2)]:
from 5 mol % to 65 mol % of the aliphatic monoamine (1), and
from 35 mol % to 95 mol % of the aliphatic monoamine (2).

[10] The adhesive conductive paste according to [6], wherein in a case where the aliphatic monoamine (1) and the aliphatic diamine (3) are used (without using the aliphatic monoamine (2)), a proportion of these components is, based on the total amines [(1)+(3)],
from 5 mol % to 65 mol % of the aliphatic monoamine (1), and
from 35 mol % to 95 mol % of the aliphatic diamine (3).

[11] The adhesive conductive paste according to any one of [1] to [10],
wherein the protective agent further contains an aliphatic carboxylic acid (4).

[12] The adhesive conductive paste according to [11],
wherein the aliphatic carboxylic acid (4) contains a saturated or unsaturated aliphatic monocarboxylic acid having from 8 to 18 carbon atoms.

[13] The adhesive conductive paste according to any one of [1] to [12],
wherein the silver particle (B) has an average particle size (median diameter) from 0.1 to 9 µm (preferably from 0.3 to 8 µm).

[14] The adhesive conductive paste according to any one of [1] to [13],
wherein the silver particle (B) has a specific surface area from 0.5 to 4.0 m²/g (preferably from 0.6 to 3.0 m²/g, more preferably from 0.7 to 2.5 m²/g, and even more preferably from 0.8 to 2.5 m²/g).

[15] The adhesive conductive paste according to any one of [1] to [14],
wherein the silver particle (B) is contained at a proportion of 40 wt. % or greater (preferably 50 wt. % or greater, and more preferably 60 wt. % or greater) out of all silver particles contained in the adhesive conductive paste.

[16] The adhesive conductive paste according to any one of [1] to [15],
wherein the silver particle (B) is contained at a proportion of 99 wt. % or less (preferably 97 wt. % or less, and more preferably 95 wt. % or less) out of all silver particles contained in the adhesive conductive paste.

[17] The adhesive conductive paste according to any one of [1] to [16],
wherein the silver particle (B) includes a silver particle (group) having an average particle size from 0.1 to 1.5 µm (more preferably 0.1 to 0.6 µm) and a silver particle (group) having an average particle size of greater than 1.5 µm and 8 µm or less (more preferably 5 to 8 µm).

[18] The adhesive conductive paste according to [17],
wherein a proportion of the silver particle (group) having an average particle size from 0.1 to 1.5 µm to the silver particle (group) having an average particle size of greater than 1.5 µm and 8 µm or less is (former/latter, in weight proportion), from 70/30 to 30/70 (preferably from 40/60 to 60/40 and more preferably from 45/55 to 55/45).

[19] The adhesive conductive paste according to any one of [1] to [18],
wherein the silver particle (B) is contained in an amount from 20 to 95 wt. % (preferably from 30 to 90 wt. %, more preferably from 40 to 90 wt. %) relative to a total amount (100 wt. %) of the adhesive conductive paste.

[20] The adhesive conductive paste according to any one of [1] to [19],
wherein the compound (C) represented by Formula (I) has a boiling point of at least 160° C. (preferably 190° C. or higher, more preferably 190° C. to 290° C., and still more preferably 200° C. to 260° C.) under normal pressure.

[21] The adhesive conductive paste according to any one of [1] to [20],
wherein the compound (C) represented by Formula (I) has a SP value $[(cal/cm^3)^{1/2}]$ of 11.0 or less (preferably 10.0 or less, and more preferably 9.0 or less) at 25° C.

[22] The adhesive conductive paste according to any one of [1] to [21],
wherein X in Formula (I) is an ethylene group, a propylene group, or a trimethylene group.

[23] The adhesive conductive paste according to any one of [1] to [22],
wherein, relative to a total amount of the solvent (100 wt. %), the compound (C) represented by Formula (I) is contained at a proportion from 70 to 100 wt. % (preferably from 80 to 100 wt. %, more preferably from 85 to 100 wt. %, still more preferably from 90 to 100 wt. %, further still more preferably from 95 to 100 wt. %, and even more preferably from 99 to 100 wt. %).

[24] The adhesive conductive paste according to any one of [1] to [23],
wherein the compound (C) represented by Formula (I) is contained in an amount from 1 to 50 parts by weight (preferably from 2 to 30 parts by weight, and more preferably from 3 to 30 parts by weight) relative to 100 parts by weight of the conductive particle (a total of the silver particle (A) and the silver particle (B)).

[25] The adhesive conductive paste according to any one of [1] to [24],
wherein a content of the solvent (a total content in a case where two or more kinds are contained) in a total amount (100% by weight) of the adhesive conductive paste is from 1% to 50% by weight (preferably from 2% to 40% by weight and more preferably from 3% to 30% by weight).

[26] The adhesive conductive paste according to any one of [1] to [25],
wherein a content of the compound (C) represented by Formula (I) (a total content in a case where two or more kinds are contained) in a total amount (100 wt. %) of the adhesive conductive paste is from 1 to 50 wt. % (preferably from 2 to 40 wt. % and more preferably from 3 to 30 wt. %).

[27] The adhesive conductive paste according to any one of [1] to [26],
wherein a content of the conductive particle (a total content in a case where two or more kinds are contained) in a total amount (100 wt. %) of the adhesive conductive paste is from 50 to 99 wt. % (preferably from 60 to 97 wt. % and more preferably from 70 to 95 wt. %).

[28] The adhesive conductive paste according to any one of [1] to [27],
wherein a total content of the silver particle (A) and the silver particle (B) in a total amount of the adhesive conductive paste (100 wt. %) is from 50 to 99.8 wt. % (preferably from 60 to 97 wt. % and more preferably from 70 to 95 wt. %).

[29] The adhesive conductive paste according to any one of [1] to [28],
wherein a proportion of a total content of the compound (C) represented by Formula (I) and the silver particle in a total amount (100 wt. %) of the adhesive conductive paste is 70 wt. % or greater (preferably 80 wt. % or greater and more preferably 90 wt. % or greater).

[30] The adhesive conductive paste according to any one of [1] to [29],
wherein a content of an organic component is 15 wt. % or less (preferably 13 wt. % or less) relative to 100 wt. % of the adhesive conductive paste.

[31] The adhesive conductive paste according to any one of [1] to [30],
wherein a content of an adhesive (for example, a polymer compound having a molecular weight of 10000 or greater, such as an epoxy resin, a silicone resin, or an acrylic resin) is 10 wt. % or less (preferably 5 wt. % or less, more preferably 1 wt. % or less, and still more preferably 0.5 wt. % or less) in a total amount (100) of the adhesive conductive paste.

[32] A method of manufacturing an electronic component, the method including:
applying the adhesive conductive paste described in any one of [1] to [31] onto a substrate, and subsequently sintering the substrate, so as to form a conductive wiring and/or a joined structure.

INDUSTRIAL APPLICABILITY

The adhesive conductive paste of the present disclosure can be suitably used for the purpose of manufacturing an electronic component (for example, a power semiconductor module, an LED module, etc.) using a printing method.

The invention claimed is:

1. An adhesive conductive paste for forming a conductive wiring and/or a joined structure to connect an electronic element, the adhesive conductive paste comprising a conductive particle and a solvent,
wherein the conductive particle comprises a silver particle (A) having an average particle size of 1 nm or more and less than 100 nm, and a silver particle (B) having an average particle size of 0.1 μm or greater and 10 μm or less, the silver particle (A) being a silver nanoparticle having a configuration in which a surface is coated with a protective agent containing amine,
wherein the solvent comprises a compound (C) that is represented by Formula (I):

$$R^a\text{—}O\text{—}(X\text{—}O)_n\text{—}R^b \quad (I)$$

where in Formula (I), $R^a$ represents a monovalent group selected from a hydrocarbon group having from 1 to 6 carbon atom(s) and an acyl group, X represents a divalent group selected from a hydrocarbon group having from 2 to 6 carbon atoms, $R^b$ represents a hydrogen atom or a monovalent group selected from a hydrocarbon group having from 1 to 6 carbon atom(s) and an acyl group, $R^a$ and $R^b$ may be the same, and n represents an integer from 1 to 3, and
wherein a content of an organic component is 15 wt. % or less relative to 100 wt. % of the adhesive conductive paste.

2. The adhesive conductive paste according to claim 1, wherein the silver particle (A) is contained at a proportion of 50 wt. % or less out of all silver particles contained in the adhesive conductive paste.

3. The adhesive conductive paste according to claim 1, wherein the protective agent in the silver particle (A) contains, as the amine, an aliphatic hydrocarbon monoamine (1) comprising an aliphatic hydrocarbon group and one amino group, the aliphatic hydrocarbon group having 6 or more carbon atoms in total, and
the protective agent further contains at least one of an aliphatic hydrocarbon monoamine (2) or an aliphatic hydrocarbon diamine (3), the aliphatic hydrocarbon monoamine (2) comprising an aliphatic hydrocarbon group and one amino group, the aliphatic hydrocarbon group having 5 or less carbon atoms in total, and the aliphatic hydrocarbon diamine (3) comprising an aliphatic hydrocarbon group and two amino groups, the aliphatic hydrocarbon group having 8 or less carbon atoms in total.

4. The adhesive conductive paste according to claim 1, wherein the compound (C) represented by Formula (I) has a boiling point of 160° C. or higher under normal pressure.

5. The adhesive conductive paste according to claim 1, wherein the compound (C) represented by Formula (I) has a SP value $[(cal/cm^3)^{1/2}]$ of 11.0 or less at 25° C.

6. The adhesive conductive paste according to claim 1, wherein X in Formula (I) is an ethylene group, a propylene group, or a trimethylene group.

7. The adhesive conductive paste according to claim 1, wherein a total content of the silver particle (A) and the silver particle (B) in a total amount of the adhesive conductive paste is from 50 to 99.8 wt. %.

8. A method of manufacturing an electronic component, the method comprising:
applying the adhesive conductive paste described in claim 1 onto a substrate and subsequently sintering the substrate, to form a conductive wiring and/or a joined structure.

* * * * *